United States Patent
Lu et al.

(10) Patent No.: US 11,686,614 B2
(45) Date of Patent: Jun. 27, 2023

(54) PHOTODETECTING DEVICE FOR DETECTING DIFFERENT WAVELENGTHS

(71) Applicant: ARTILUX, INC., Menlo Park, CA (US)

(72) Inventors: Yen-Cheng Lu, Hsinchu County (TW); Yun-Chung Na, Hsinchu County (TW); Shu-Lu Chen, Hsinchu County (TW); Chien-Yu Chen, Hsinchu County (TW); Szu-Lin Cheng, Hsinchu County (TW); Chung-Chih Lin, Hsinchu County (TW); Yu-Hsuan Liu, Hsinchu County (TW)

(73) Assignee: ARTILUX, INC., Menlo Park, CA (US)

( * ) Notice: Subject to any disclaimer, the term of this patent is extended or adjusted under 35 U.S.C. 154(b) by 0 days.

(21) Appl. No.: 17/562,948

(22) Filed: Dec. 27, 2021

(65) Prior Publication Data

US 2022/0120611 A1    Apr. 21, 2022

Related U.S. Application Data

(63) Continuation of application No. 16/734,918, filed on Jan. 6, 2020, now Pat. No. 11,255,724.

(Continued)

(51) Int. Cl.
  *G01J 1/44*    (2006.01)
  *H01L 31/101*  (2006.01)

(52) U.S. Cl.
  CPC ............ *G01J 1/44* (2013.01); *H01L 31/1013* (2013.01); *G01J 2001/446* (2013.01)

(58) Field of Classification Search
  CPC .... G01J 1/44; G01J 2001/446; H01L 31/1013
  See application file for complete search history.

(56) References Cited

U.S. PATENT DOCUMENTS 11,255,724 B2 *  2/2022  Lu .............................. G01J 1/44
2016/0300870 A1  10/2016  Keelan et al.

FOREIGN PATENT DOCUMENTS

CN    108140660 A    6/2018

OTHER PUBLICATIONS

Non-final Office Action and Search Report of CN family patent Application No. 2020100101440, dated Apr. 12, 2022.

(Continued)

*Primary Examiner* — Georgia Y Epps
*Assistant Examiner* — Don J Williams
(74) *Attorney, Agent, or Firm* — WPAT, P.C., Intellectual Property Attorneys; Anthony King

(57) ABSTRACT

A photodetecting device is provided. The photodetecting device includes a first photodetecting component including a substrate having a first absorption region configured to absorb photons having a first peak wavelength and to generate first photo-carriers, and a second photodetecting component including a second absorption region configured to absorb photons having a second peak wavelength different from the first peak wavelength and to generate second photo-carriers. The first photodetecting component further includes two first readout circuits and two first control circuits for the first photo-carriers and electrically coupled to the first absorption region. The second photodetecting component further includes two second readout circuits and two second control circuits for the second photo-carriers and electrically coupled to the second absorption region, wherein the two second readout circuits are separated from the two first readout circuits, and the two second control circuits are separated from the two first control circuit.

17 Claims, 31 Drawing Sheets

Related U.S. Application Data

(60) Provisional application No. 62/860,264, filed on Jun. 12, 2019, provisional application No. 62/788,931, filed on Jan. 6, 2019.

(56) References Cited

OTHER PUBLICATIONS

Brief English translation of the Non-final Office Action and Search Report of CN family patent Application No. 2020100101440, dated Apr. 12, 2022.
English translation of the abstract of CN 108140660A.
Final Office Action of CN family patent Application No. 2020100101440, dated Jan. 18, 2023.
Brief English translation of the Final Office Action of CN family patent Application No. 2020100101440, dated Jan. 18, 2023.

\* cited by examiner

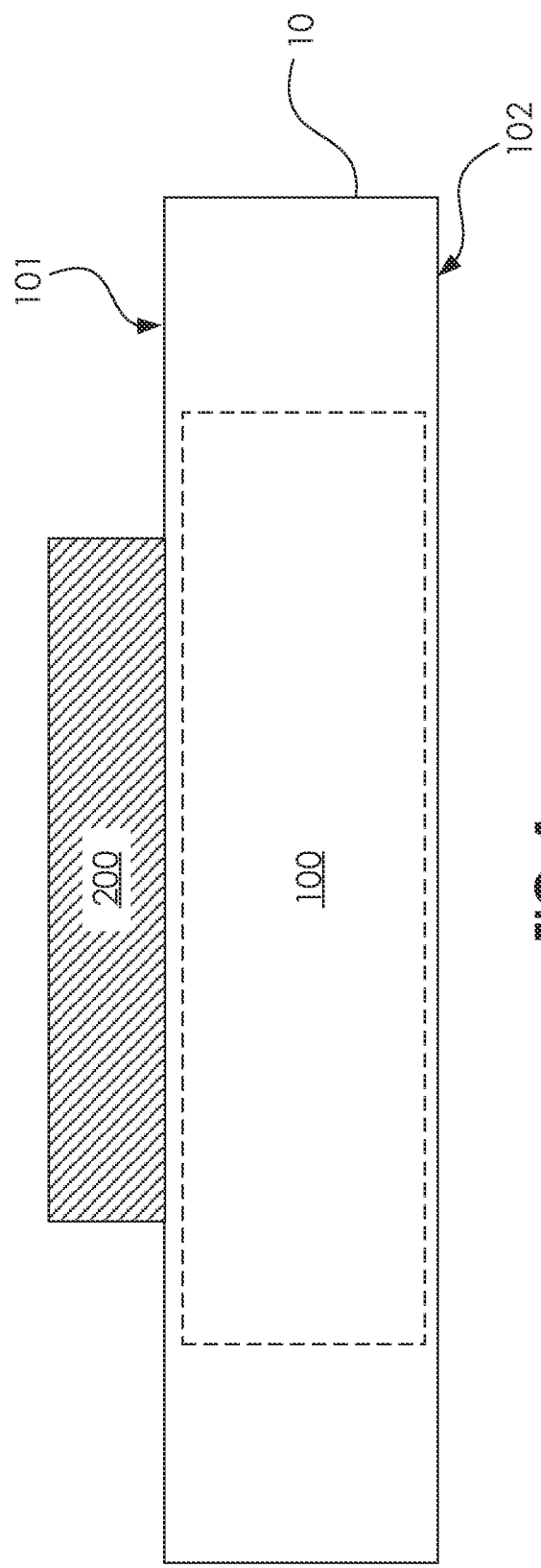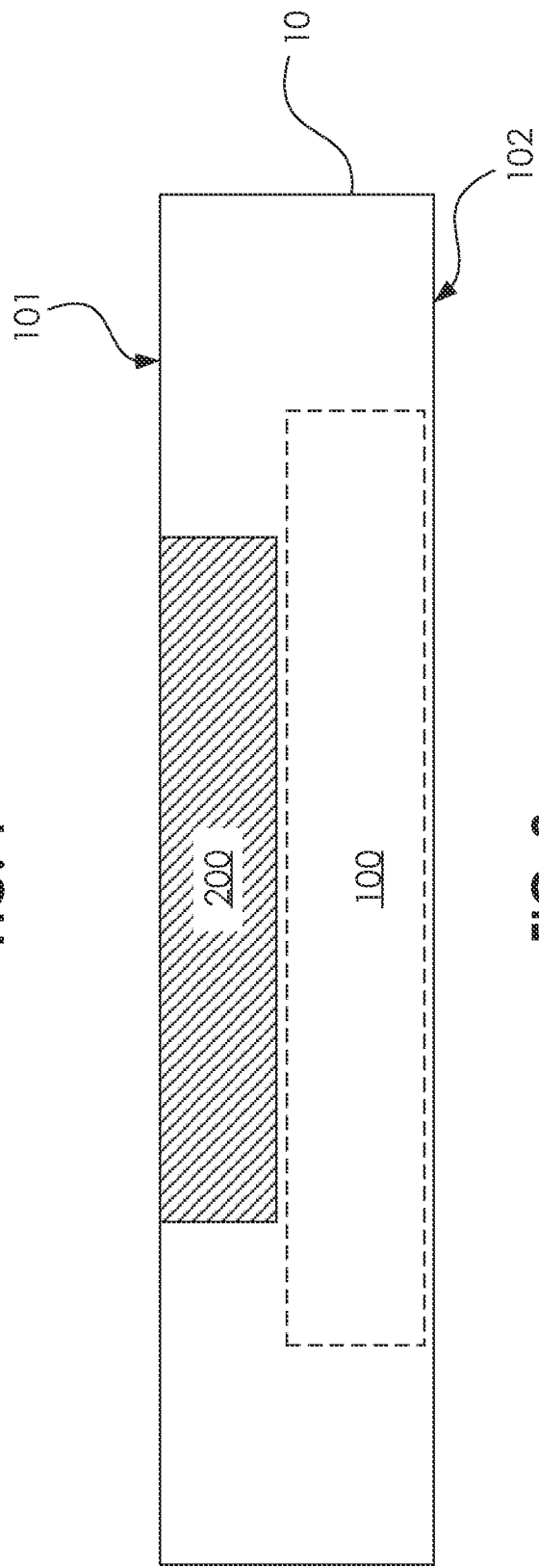

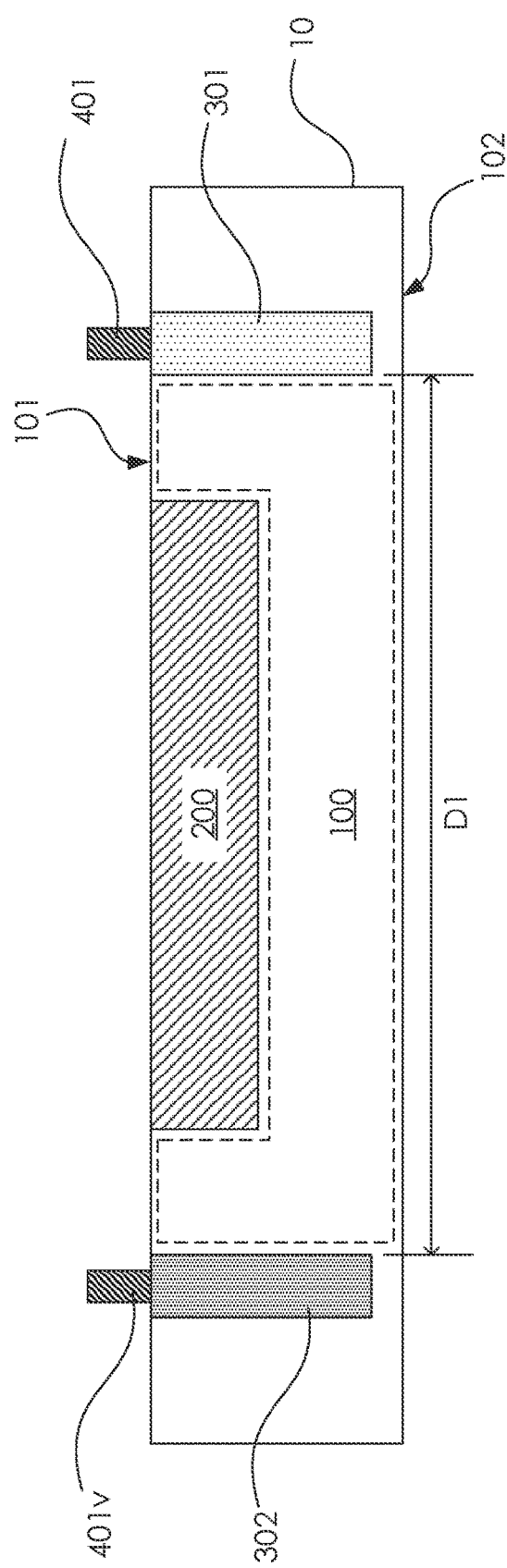
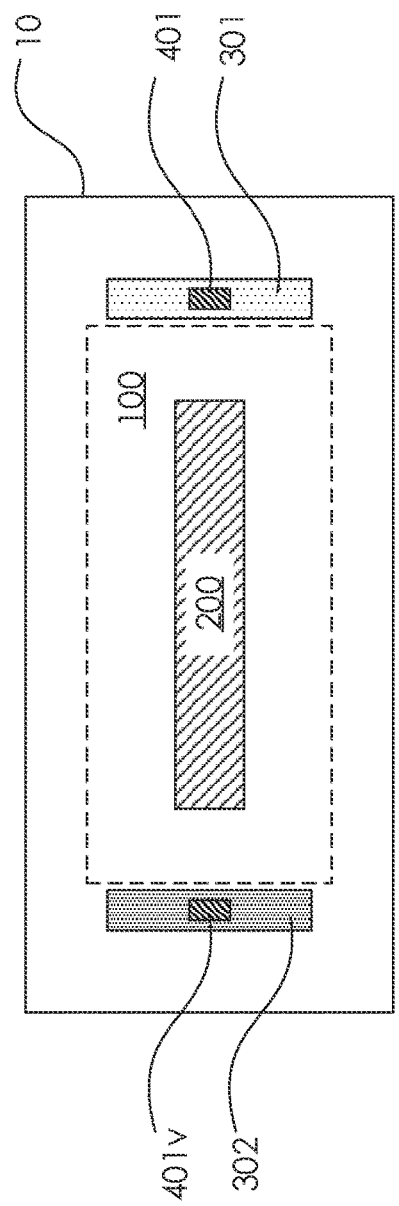
FIG. 3A
FIG. 3B

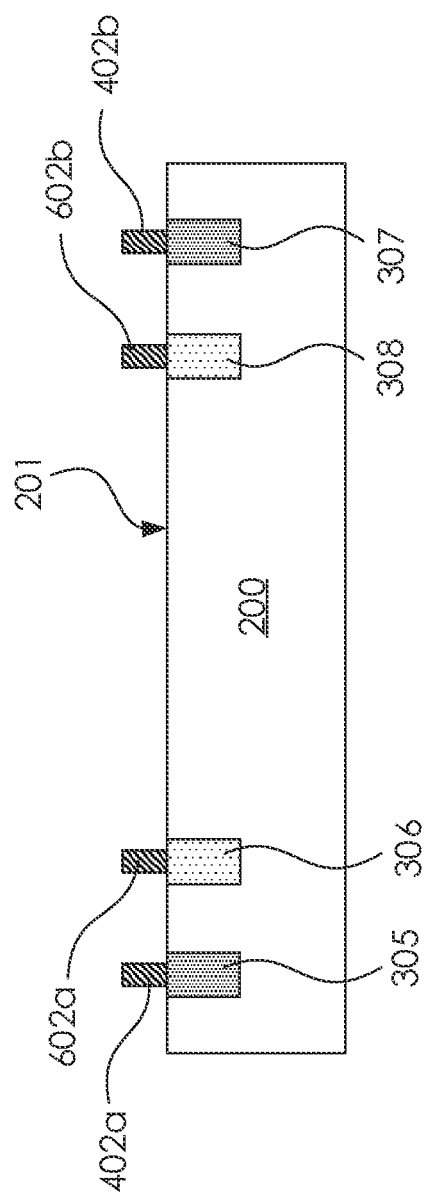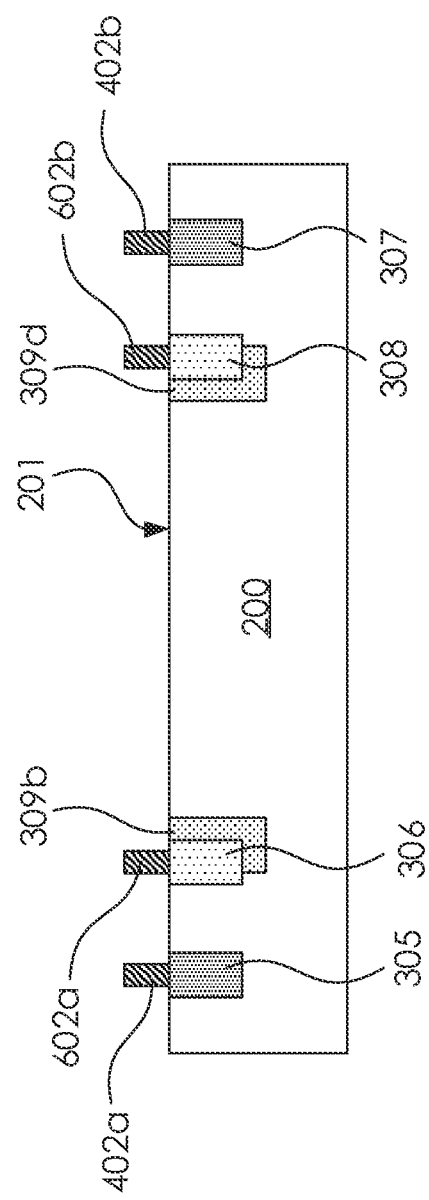

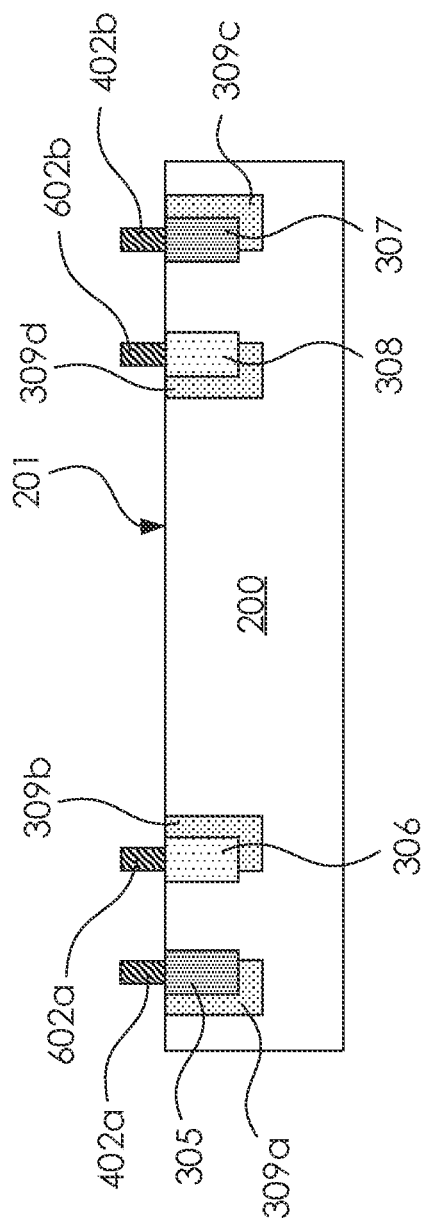
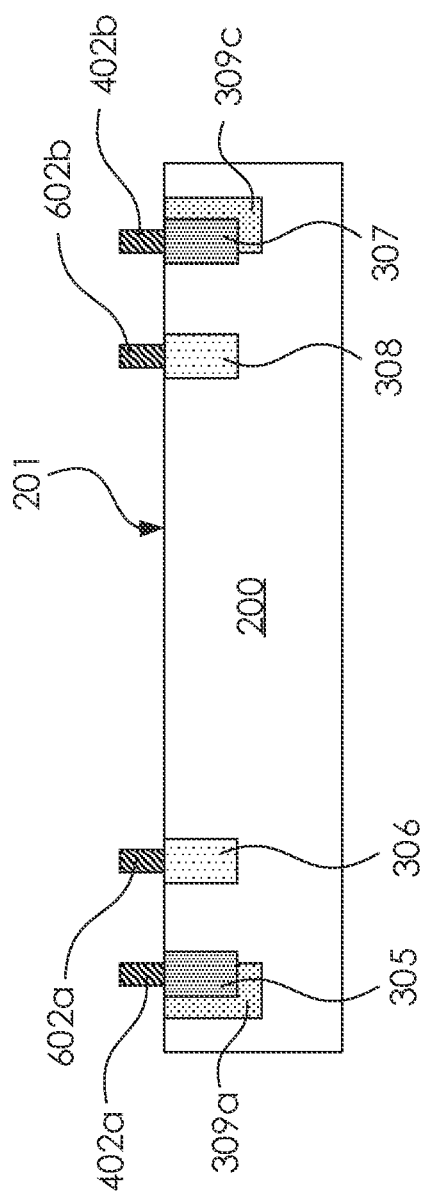
FIG. 15E
FIG. 15F

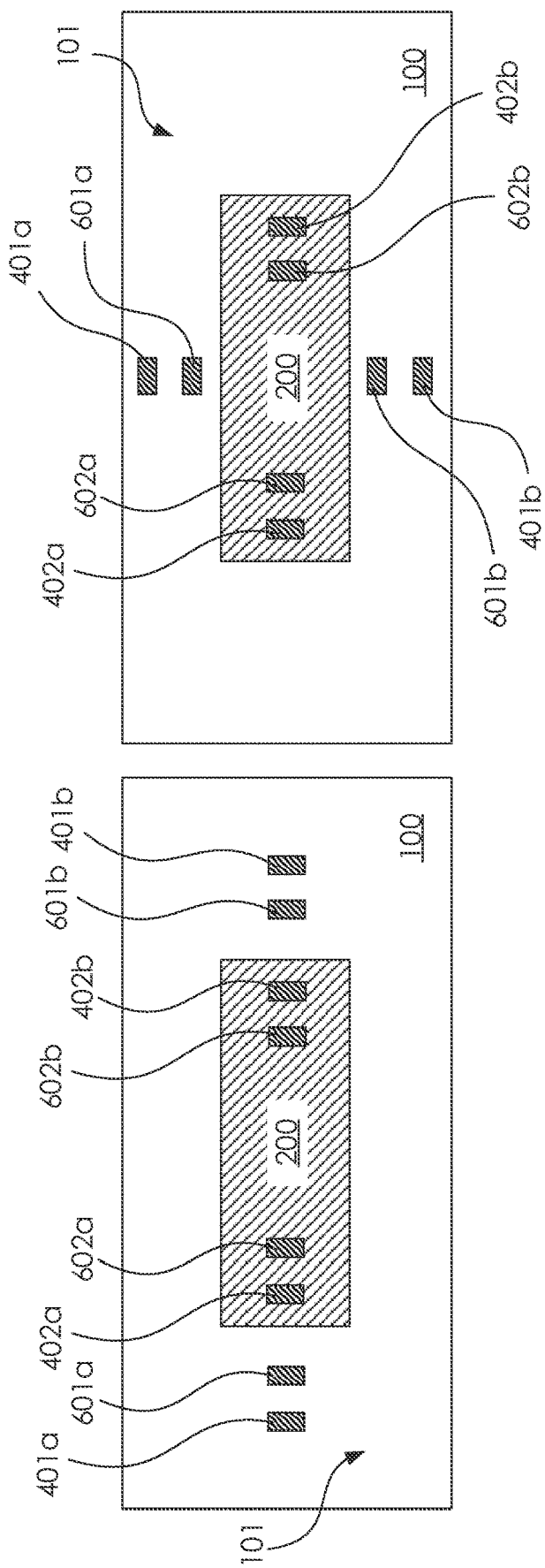

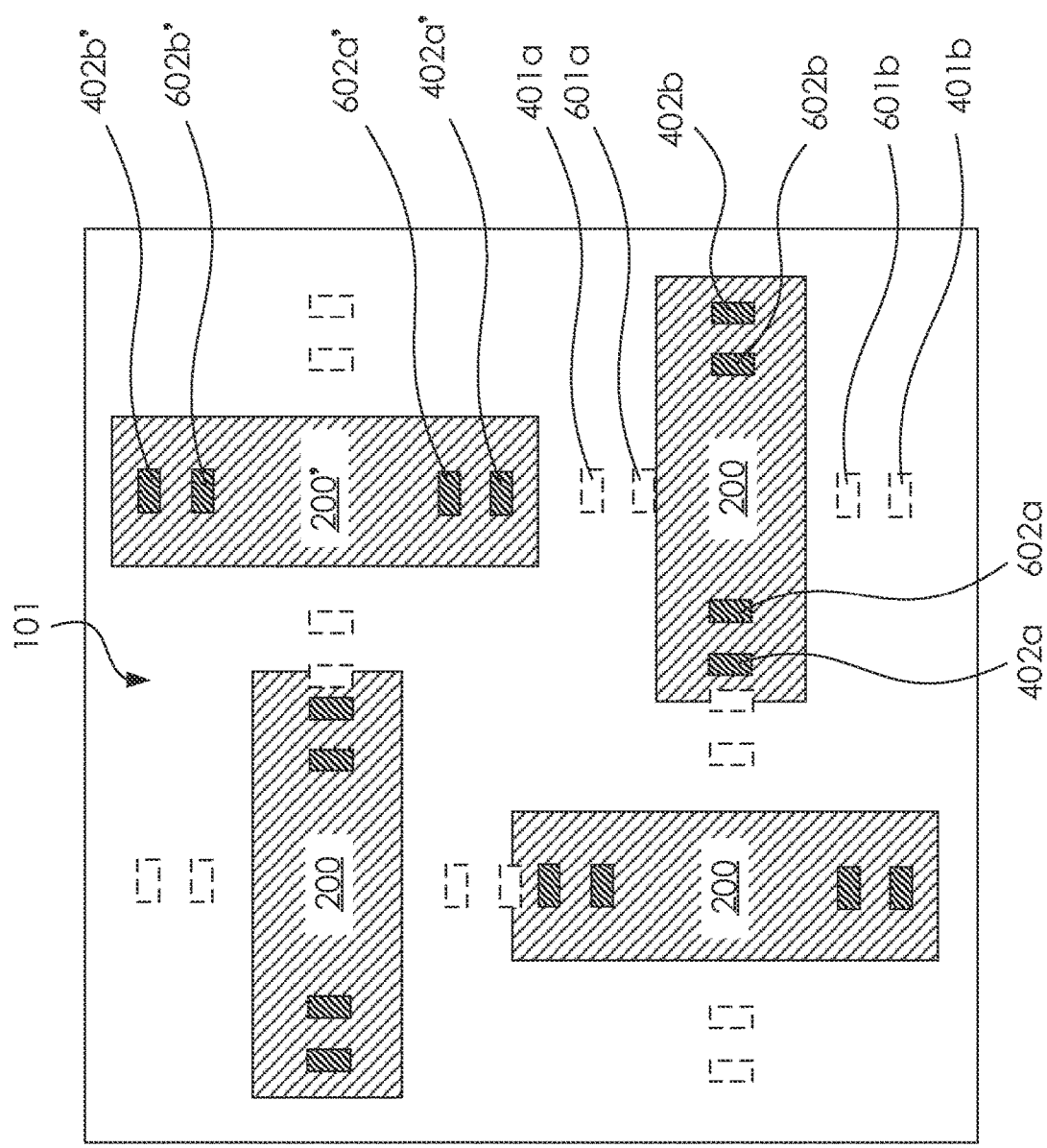

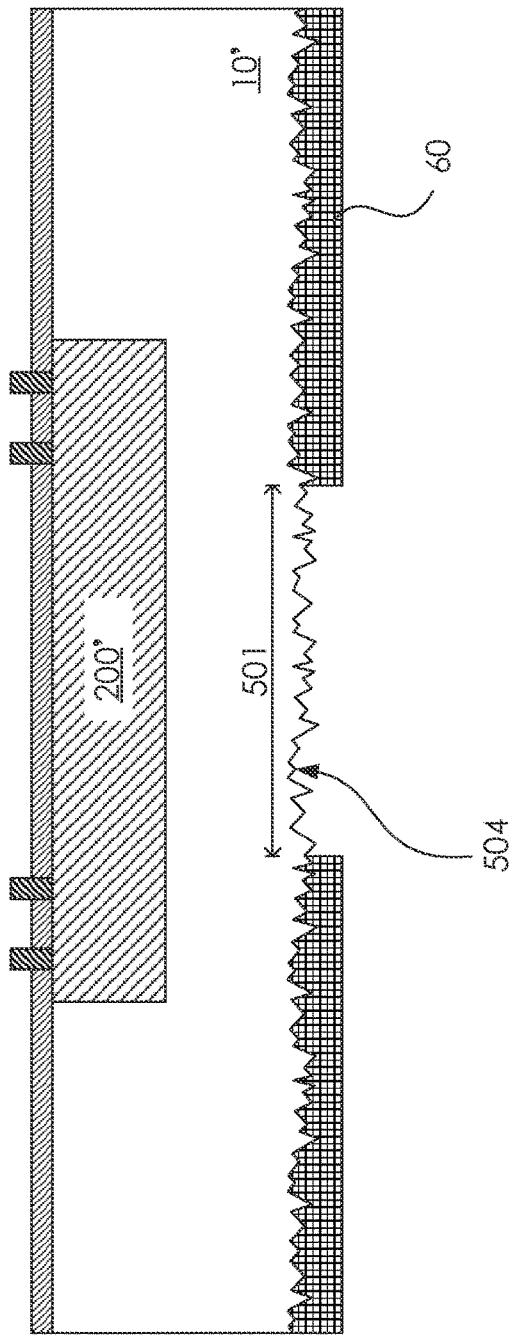
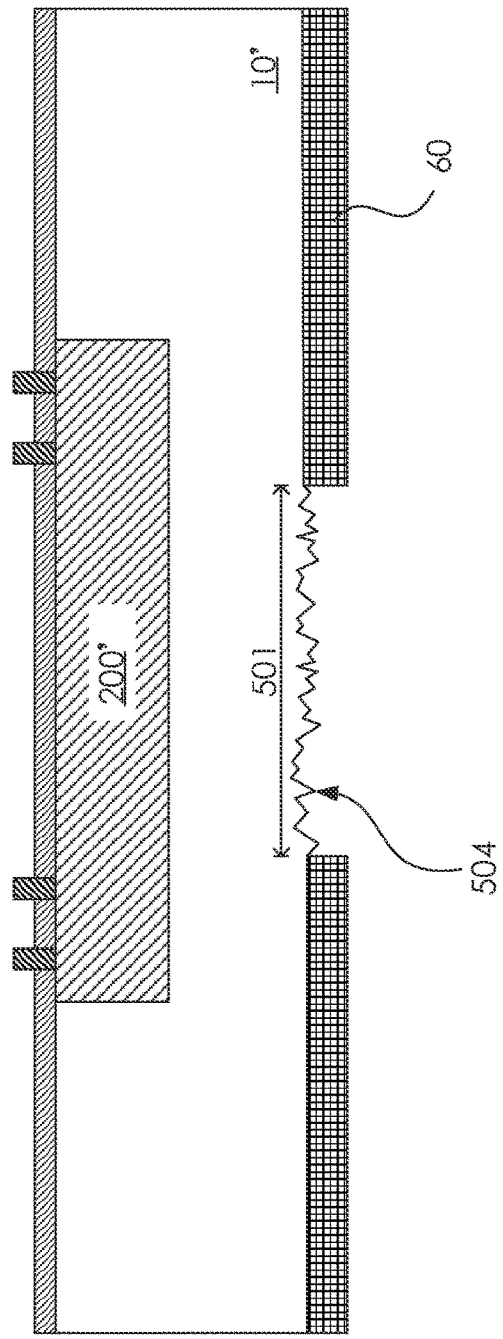

PHOTODETECTING DEVICE FOR DETECTING DIFFERENT WAVELENGTHS

CROSS REFERENCE TO RELATED APPLICATIONS

The present application is a continuation application of prior-filed U.S. application Ser. No. 16/734,918, filed Jan. 6, 2020, and claims the benefit of U.S. provisional application 62/788,931, filed on Jan. 6, 2019, and U.S. provisional application 62/860,264, filed on Jun. 12, 2019, which are incorporated by reference herein in their entireties.

FIELD

The present disclosure is related to a photodetecting device, more particularly, to a photodetecting device for detecting different wavelengths that including two sensors react with two absorption regions sensitive to two different peak wavelengths, respectively.

BACKGROUND

In recent years, image recognition with convolutional neural networks (CNNs) has made significant progress and surpassed human accuracy in many applications. For deep learning algorithm, the more input channels and the better quality of pixel alignment between each input channel, such as R, G, B, intensity and depth, the less the error rates.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 1 illustrates a cross-sectional view of a photodetecting device according to some embodiments of the present disclosure.

FIG. 2 illustrates a cross-sectional view of a photodetecting device according to some embodiments of the present disclosure.

FIG. 3A illustrates a cross-sectional view of a photodetecting device according to some embodiments of the present disclosure.

FIG. 3B illustrates a top view of a photodetecting device according to some embodiments of the present disclosure.

FIGS. 15A, 15B, 15C, 15D, 15E, and 15F illustrate cross-sectional views of a second photodetecting component according to some embodiments of the present disclosure.

FIGS. 16A, 16B, and 16C illustrate top views of a photodetecting device according to some embodiments of the present disclosure.

FIG. 16E illustrates a top view of a photodetecting device according to some embodiments of the present disclosure.

FIGS. 18A and 18B illustrate cross-sectional views of a photodetecting device according to some embodiments of the present disclosure.

DETAILED DESCRIPTION

Figure 3C:
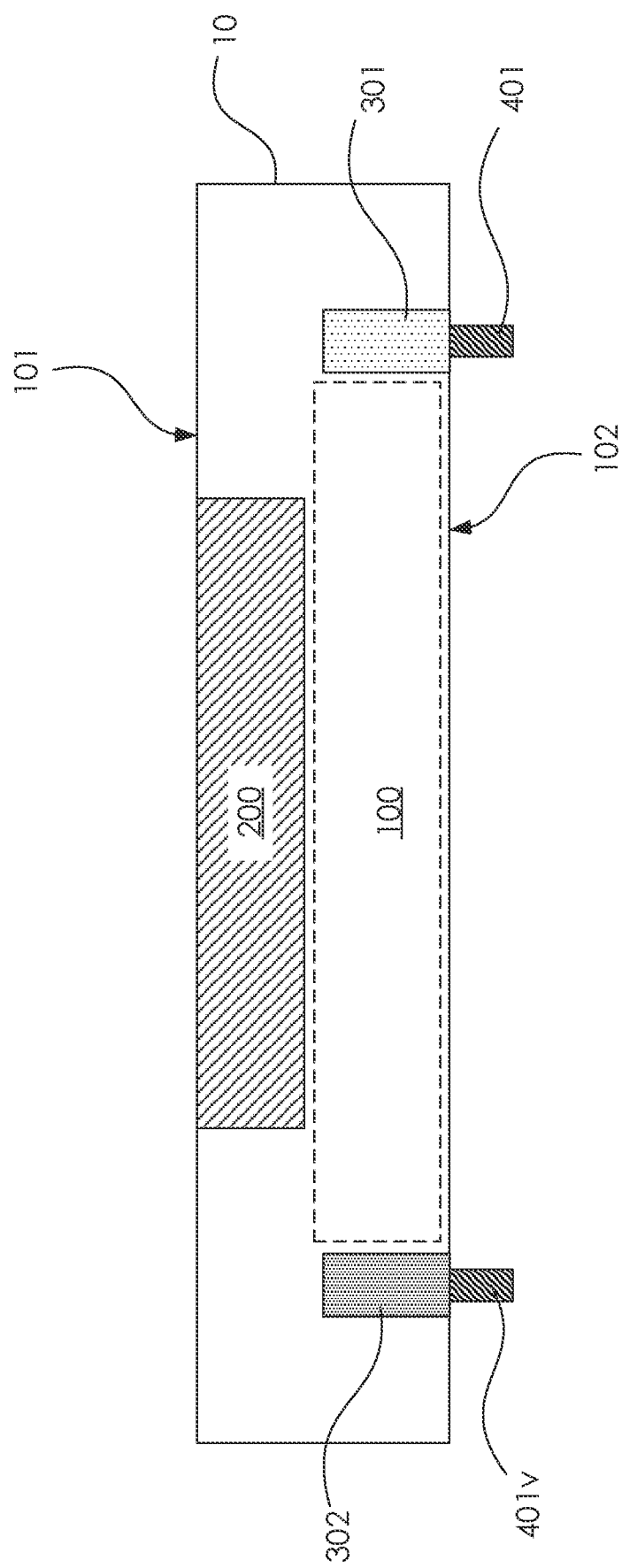
FIG. 3C illustrates a cross-sectional view of a photodetecting device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

In the present disclosure, a photodetecting device is capable of converting an optical signal to an electrical signal. The term "germanium-silicon (GeSi)" refers to a $Ge_xSi_{1-x}$, wherein $0<x<1$. The term "intrinsic" refers to a semiconductor material without intentionally adding dopants.

In some embodiments, based on the small bandgap of germanium, the germanium on silicon structure may potentially react with two different optical wavelength bands. In some embodiments of the present disclosure, the germanium sensor is vertically integrated with the silicon sensor where silicon sensor is designed to react with short wavelength parts of incident light while germanium sensor may absorb the rest of longer parts. In the meantime, in some embodiments, color filters may be used to choose desired wavelengths for sensing, such as the wavelengths can be absorbed by the silicon sensor, or to filter out those unwanted wavelengths, such as those wavelengths partially absorbed by the silicon sensors and the germanium sensors. The germanium and silicon sensors integrated in a device may be applied as image sensors or Time of Flight (TOF) sensors individually. Alternatively, they could be image sensors and TOF sensors alternately with Time Division Multiplexing (TDM). By vertically stacking the silicon and germanium sensor s, when the silicon sensor and the germanium sensor are both applied as CMOS image sensors or one of the silicon sensor and the germanium sensor is applied as a CMOS image sensor and the other is applied as a TOF sensor, the channel alignment accuracy may be improved. By vertically stacking the silicon and germanium sensor, when the silicon sensor and the germanium sensor are both applied as TOF sensors, the dealiasing ability may be improved.

FIG. 1 is a cross-sectional view of a photodetecting device, in accordance with some embodiments of the present disclosure. The photodetecting device may include a first photodetecting component (not labeled) including a substrate 10, and a second photodetecting component (not labeled) coupled to the substrate 10. The first photodetecting component includes a first absorption region 100 in the substrate 10. The second photodetecting component includes a second absorption region 200 over the first absorption region 100. The first absorption region 100 is configured to absorb photons having a first peak wavelength and to generate first photo-carriers. The substrate 10 includes a first surface 101 and a second surface 102 opposite to the first surface 101. The first absorption region 100 is between the first surface 101 and the second surface 102. The second absorption region 200 is supported by the substrate 10, for example, over the first surface 101 of the substrate 10. Although not illustrated in FIG. 1, the second absorption region 200 may be partially embedded in the substrate 10 with various extents of protrusion. The second absorption region 200 is configured to absorb photons having a second peak wavelength different from the first peak wavelength and to generate second photo-carriers. In some embodiments, the second peak wavelength is in an invisible wavelength range not less than about 800 nm, such as 850 nm, 940 nm, 1050 nm, 1064 nm, 1310 nm, 1350 nm, or 1550 nm. In some embodiments, the invisible wavelength range is not more than about 2300 nm. In some embodiments, the photons are from an optical signal. In some embodiments, the first absorption region 100 is configured to absorb photons having a first wavelength range and to generate first photo-carriers. The second absorption region 200 is configured to absorb photons having a second wavelength range different from the first wavelength range and to generate second photo-carriers. A part of the second wavelength range is in an invisible wavelength range, such as between about 1000 nm and about 2300 nm.

In some embodiments, the first absorption region 100 includes a first material having a first bandgap, and the second absorption region 200 includes a second, material having a second bandgap. In some embodiments, the second bandgap is smaller than the first bandgap. In some embodiments, the first material has a first absorption coefficient at a wavelength range from about 1000 nm to about 1600 nm. The second material has a second absorption coefficient at a wavelength range from about 1000 nm to about 1600 nm. The second absorption coefficient is greater than the first absorption coefficient, for example, the second absorption coefficient is at least 10 times greater than the first absorption coefficient. In some embodiment, the second absorption coefficient is at least 100 times greater than the first absorption coefficient. In some embodiments, the first material and the second material include a semiconductor material including a Group III element, Group IV element, or a Group V element. In some embodiments, at least one of the elements in the second material is different from an element in the first material. In some embodiments, the second absorption region 200 includes germanium-tin (GeSn), germanium (Ge), silicon-germanium (SiGe) or gallium antimonide (GaSb). In some embodiments, the first absorption region 100 includes silicon (Si) with a bandgap at about 1.11 eV at 300K, whereas the second absorption region 200 includes germanium with a bandgap at about 0.67 eV at 300K. In some embodiments, the first absorption region 100 and the second absorption region 200 are overlapped along a vertical direction from the first absorption region 100 to the second absorption region 200. In some embodiments, the incident optical signal enters into the first absorption region 100 and the second absorption region 200 from the second surface 102 of the substrate 10.

In some embodiments, the second absorption region 200 has a thickness depending on the wavelength of photons to be detected and the material of the second absorption region 200. In some embodiments, the second absorption region 200 has a thickness not less than 0.1 um. In some embodiments, the second absorption region 200 has a thickness between 0.1 um and 2.5 um. In some embodiments, the second absorption region 200 has a thickness between 1 um and 2.5 um for higher quantum efficiency. In some embodiments, when the second absorption region 200 includes germanium and is designed to absorb photons having a wavelength not less than about 800 nm, the second absorption region 200 has a thickness not less than 0.1 um. In some embodiments, when the second absorption region 200 includes germanium and is designed to absorb photons having a wavelength between about 1000 nm and about 2300 nm, the second absorption region 200 has a thickness between 0.1 um and 2.5 um.

In some embodiments, the photodetecting device may include a block layer (not shown) having an opening for defining the position of the first absorption region 100. In other words, the opening is for allowing an incident optical signal enter into the substrate 10 and thus defining the position of the first absorption region 100 in the substrate 10. In some embodiments, the block layer is on the second surface 102 of the substrate 10. In other words, the block layer and the second absorption region 200 are at two opposite sides of the substrate 10. In some embodiments, a shape of the opening can be ellipse, circle, rectangular, square, rhombus, octagon or any other suitable shape from a top view of the opening.

As shown in FIG. 2, in some embodiments, the second absorption region 200 may be fully embedded in the substrate 10 and proximal to a first surface 101 of the substrate 10. In some embodiments, a top surface of the second absorption region 200 may be substantially coplanar with the first surface 101 of the substrate 10. In some embodiments, the second absorption region 200 is laterally surrounded by the substrate 10, for example, the sidewall of the second absorption region 200 is surrounded by the substrate 10.

Referring to FIG. 3A, in some embodiments, the first photodetecting component further includes a first doped region 301 and a second doped region 302 in the substrate 10. The first absorption region 100 is between the first doped region 301 and a second doped region 302. The first doped region 301 may have a first conductivity type and adjacent to the first absorption region 100. For example, the first doped region 301 may extend from a position proximal to a first surface 101 toward the second surface 102 of the substrate 10, and the first doped region 301 may at least partially laterally overlap with the first absorption region 100 along a horizontal direction. The second doped region 302 may have a second conductivity type different from the first conductivity type and adjacent to the first absorption region 100. For example, the second doped region 302 may extend from a position proximal to a first surface 101 toward the second surface 102 of the substrate 10, and the second doped region 302 may at least partially laterally overlap with the first absorption region 100 along a horizontal direction.

In some embodiments, the first conductivity type may be p type, and the second conductivity type may be n type, whereas in some other embodiments, the opposite conductivity types may be implemented. In some embodiments, the first absorption region 100 is between the first doped region 301 and the second doped region 302 from a cross-sectional view of the photodetecting device. In some embodiments, a diameter or a width of the opening of the block layer is substantial equal to the minimum distance D1 between the first doped region 301 and the second doped region 302.

The first doped region 301 and the second doped region 302 are formed to collect first photo-carriers generated by the first absorption region 100. In some embodiments, the first doped region 301 includes a dopant having a peak concentration higher than a peak concentration of a dopant of the substrate 10. In some embodiments, the substrate 10 may be intrinsic. In some embodiments, the peak concentration of the dopant of the first doped region 301 is in a range of from about $5E18$ $cm^{-3}$ to about $5E20$ $cm^{-3}$ to allow an Ohmic contact to be formed between a carrier control terminal 401 and the first doped region 301. For instance, the first doped region 301 may have a p+ doping, where the activated dopant concentration may be as high as a manufacturing operation may achieve. In some embodiments, the doping concentration of the p-doped first doped region 301 may be lower than about $5E20$ $cm^{-3}$ to ease the manufacturing complexity. Similarly, in some embodiments, the second doped region 302 includes a dopant having a peak concentration in a range of from about $5E18$ $cm^{-3}$ to about $5E20$ $cm^{-3}$ to allow an Ohmic contact to be formed between the carrier control terminal 401v and the second doped region 302. For instance, the second doped region 302 may have an n+ doping, where the activated dopant concentration may be as high as a manufacturing operation may achieve. In some embodiments, the doping concentration of the n-doped second doped region 302 may be lower than about $5E20$ $cm^{-3}$ to ease the manufacturing complexity. As shown in FIGS. 3A and 3B, in some embodiments, the first doped region 301 and the second doped region 302 are deep enough to partially surround the two lateral sides of the first absorption region 100. In some embodiments, the p-type dopant includes a group-III element. In some embodiments, the p-type dopant is boron. In some embodiments, the n-type dopant includes a group-V element. In some embodiments, the n-type dopant is phosphorous.

In some embodiments, as shown in FIGS. 3A to 3C, the carrier control terminal 401 is connected to a readout circuit for one type of the photo-carriers generated in the first absorption region 100 and electrically coupled to the first doped region 301 or the second doped region 302. The readout circuit may be in a three-transistor configuration consisting of a reset gate, a source-follower, and a selection gate, or any suitable circuitry for processing charges. In such embodiments, the first doped region 301 or the second doped region 302 that not coupled to the readout circuit may be coupled to a voltage source or a ground instead through another carrier control terminal 401v, such as, depending on the operation conditions. In some embodiments, the readout circuit includes four or more transistors (not shown), or any suitable electronic components (not shown) for processing carriers.

In some embodiments, the first photodetecting component is designed to process electrons. For example, the doped regions 301/302 are designed to collect different types of the first photo-carriers, where the second doped region 302 (e.g., n-doped) is designed to collect electrons, the carrier control terminal 401v coupled to the second doped region 302 is connected to a readout circuit for processing the collected electrons, the first doped region 301 (e.g., p-doped) is designed to collect holes, and the carrier control terminal 401 coupled to the first doped region 301 is grounded in order to evacuate holes. In some embodiments, the first photodetecting component is designed to process holes, the doped regions 301/302 are designed to collect different types of the first photo-carriers, where the first doped region 301 (e.g., p-doped) is designed to collect holes, the carrier control terminal 401 coupled to the first doped region 301 is connected to a readout circuit for processing collected holes, the second doped region 302 (e.g., n-doped) is designed to collect electrons, and the carrier control terminal 401v coupled to the second doped region 302 is biased at a suitable level (e.g., $V_{DD}$) in order to evacuate electrons. Referring to FIG. 3B, the carrier control terminals 401/401v coupled to the doped regions 301/302, respectively, may be two discrete conductive channels connected to different levels of bias. In some embodiments, the carrier control terminals 401/401v include metals or alloys. For example, the carrier control terminals 401/401v include aluminum (Al), copper (Cu), tungsten (W), titanium (Ti), tantalum-tantalum nitride-copper (Ta—TaN—Cu) stack, or titanium-titanium nitride-tungsten (Ti—TiN—W) stack.

Referring to FIG. 3C, in some embodiments, the first doped region 301 and the second doped region 302 may be in contact with the second surface 102 of the substrate 10. The second surface 102 is opposite to the first surface 101, thereby the first doped region 301 and the second doped region 302 extends from a position proximal to the second surface 102 and toward the first surface 101. In some embodiments, the lateral sides of the second absorption region 200 are not surrounded by the first doped region 301 and the second doped region 302 when the first doped region 301 and the second doped region 302 are in contact with the second surface 102 of the substrate 10.

Figure 4A:
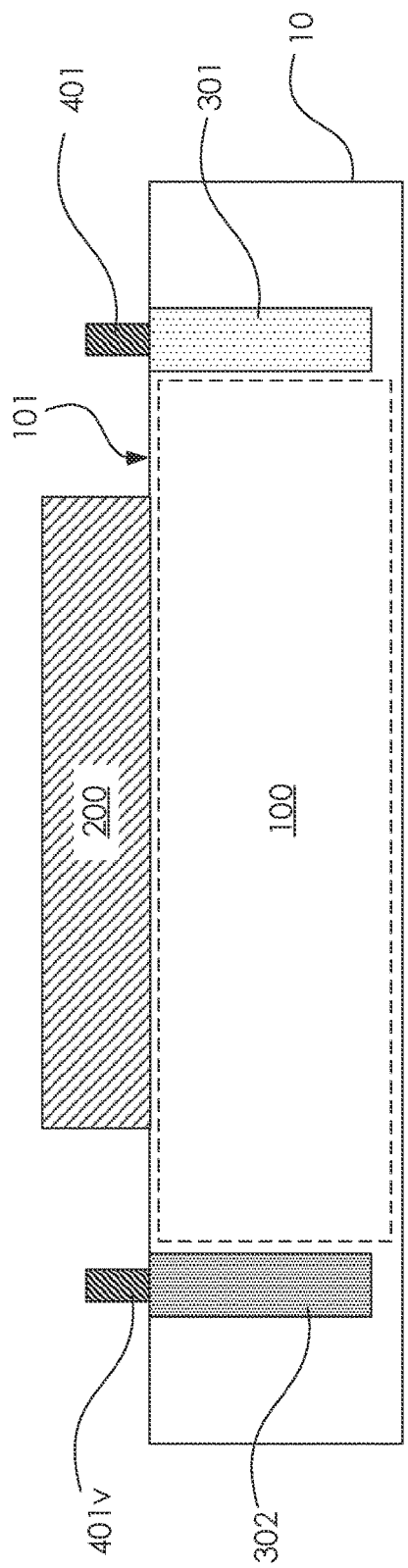
FIGS. 4A and 4B illustrate cross-sectional views of a photodetecting device according to some embodiments of the present disclosure.

Referring to FIG. 4A, in some embodiments, the second absorption region 200 may be entirely formed on the first surface 101 of the substrate 10. In some embodiments, the carrier control terminals 401, 401v are at lateral sides of the second absorption region 200 from a cross sectional view of the of the photodetecting device. The first doped region 301 and the second doped region 302 are at two lateral sides of the first absorption region 100 from a cross sectional view of the of the photodetecting device. In some embodiments, the minimum distance D1 between the first doped region 301 and the second doped region 302 is greater than a width of the second absorption region 200 from a cross sectional view of the of the photodetecting device. In some embodiments, the second absorption region 200 may be partially on the first surface 101 of the substrate 10 and partially in the substrate 10.

Figure 4B:
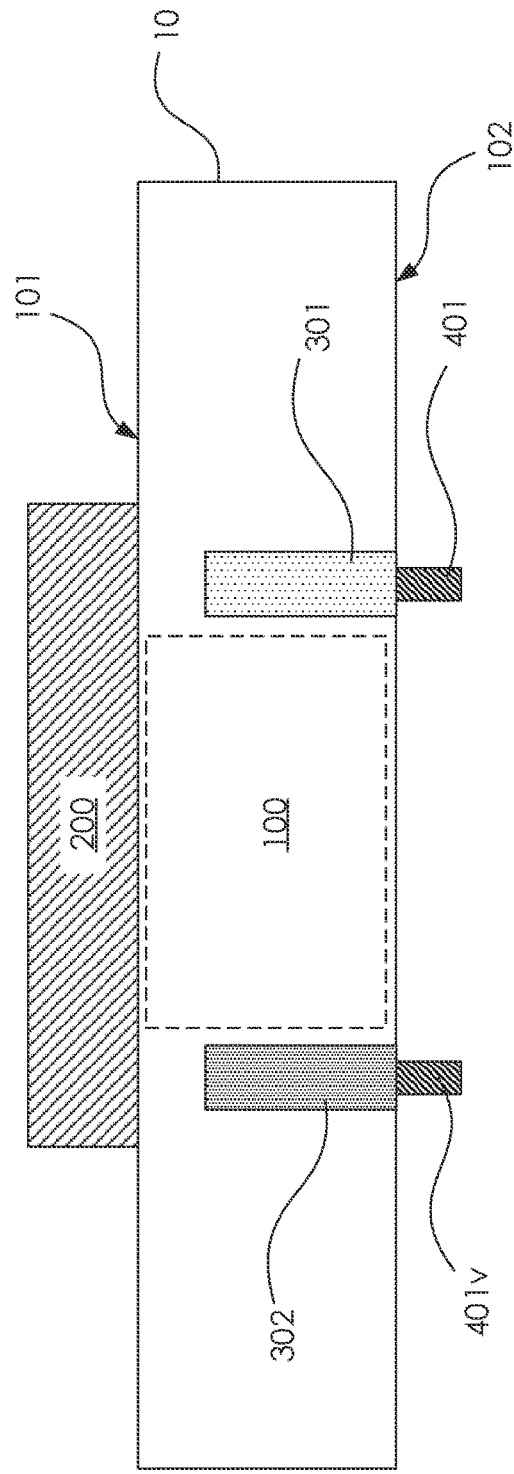

Referring to FIG. 4B, in some embodiments, the second absorption region 200 is entirely formed on the first surface 101 of the substrate 10, and the first doped region 301 and the second doped region 302 are in contact with the second surface 102 of the substrate 10. In some embodiments, the first doped region 301 and the second doped region 302 may overlap with the second absorption region 200 in a vertical direction from the first absorption region 100 to the second absorption region 200. In some embodiments, the second absorption region 200 may be wider than the first absorption region 100. Although not illustrated in FIG. 4B, the first absorption region 100 can be wider than the second absorption region 200, depending on various manufacturing consideration, such that the first doped region 301 and the second doped region 302 are not overlapped with the second absorption region 200 in a vertical direction.

Figure 5:
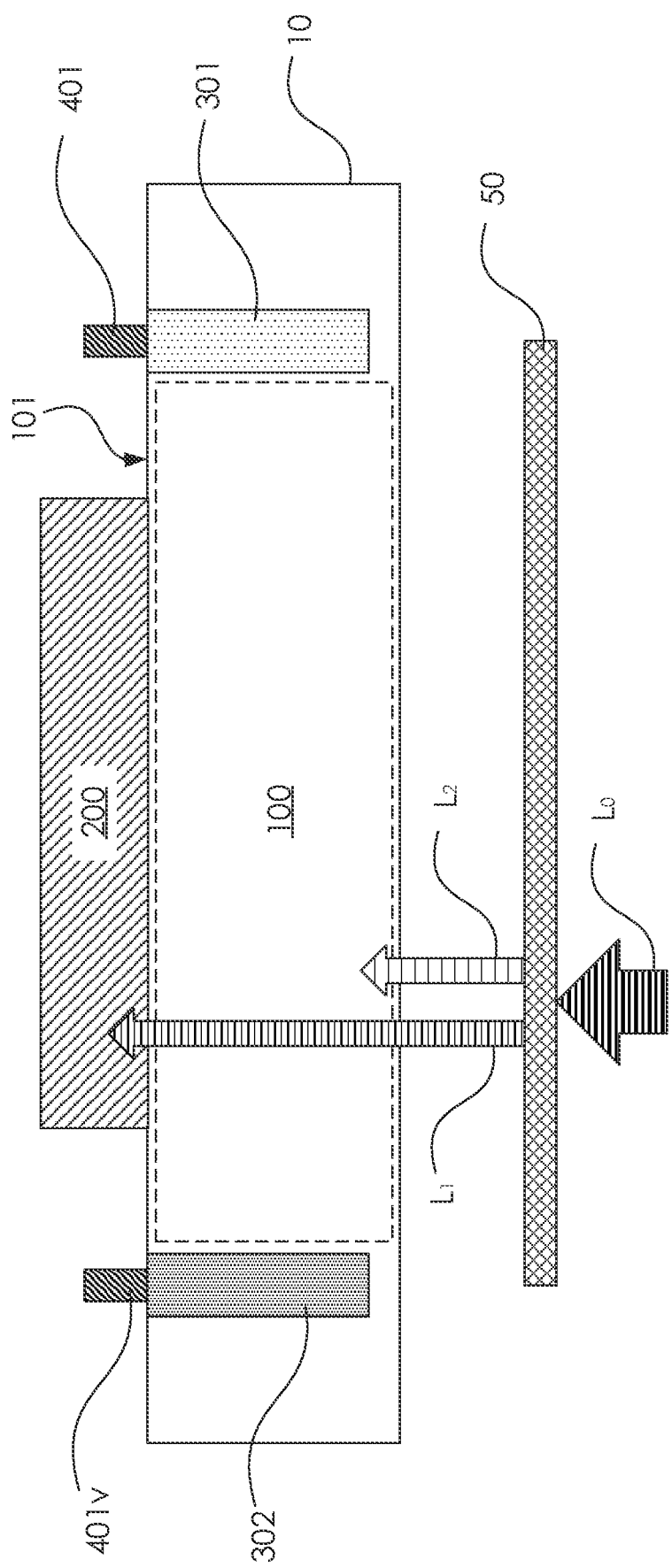
FIG. 5 illustrates a cross-sectional view of a photodetecting device according to some embodiments of the present disclosure.

Referring to FIG. 5, in some embodiments, an optical filter 50 may be used to filter out two optical signals $L_1$, $L_2$ with different wavelength ranges from an optical signal $L_0$. The substrate 10 is between the optical filter 50 and the second absorption region 200 such that the filtered optical signal enters into the first absorption region 100 and the second absorption region 200 from the second surface 102 of the substrate 10. In such embodiments, the first absorption region 100 may absorb a filtered optical signal $L_2$ with wavelength shorter than about 1000 nm such as between 400 nm and 800 nm, whereas the second absorption region 200 may absorb a filtered optical signal $L_1$ with wavelength greater than about 1000 nm, such as between 1000 nm and 1600 nm. By using an optical filter 50, an undesired wavelength range may be removed to reduce the noise of the first photodetecting component and the noise of the second photodetecting component. In some embodiments, the second photodetecting component may be used as a Time of Flight (TOF) sensor, whereas the first absorption region 100 may be used as an optical signal intensity sensor. In other words, two channels of data may be acquired under a single illumination in a single photodetecting device. For example, one of the channels is the data of depth and the other channel is the data of the intensity of the optical signal $L_1$. In some embodiments, the optical signal $L_0$ is reflected from a three-dimensional object.

Figure 6A:
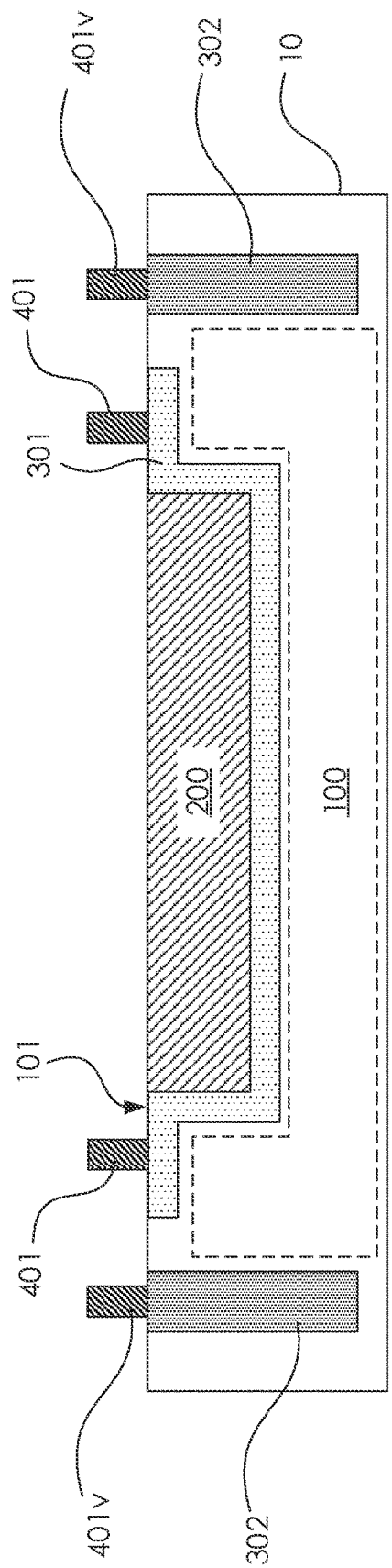
FIG. 6A illustrates a cross-sectional view of a photodetecting device according to some embodiments of the present disclosure.
Figure 6B:
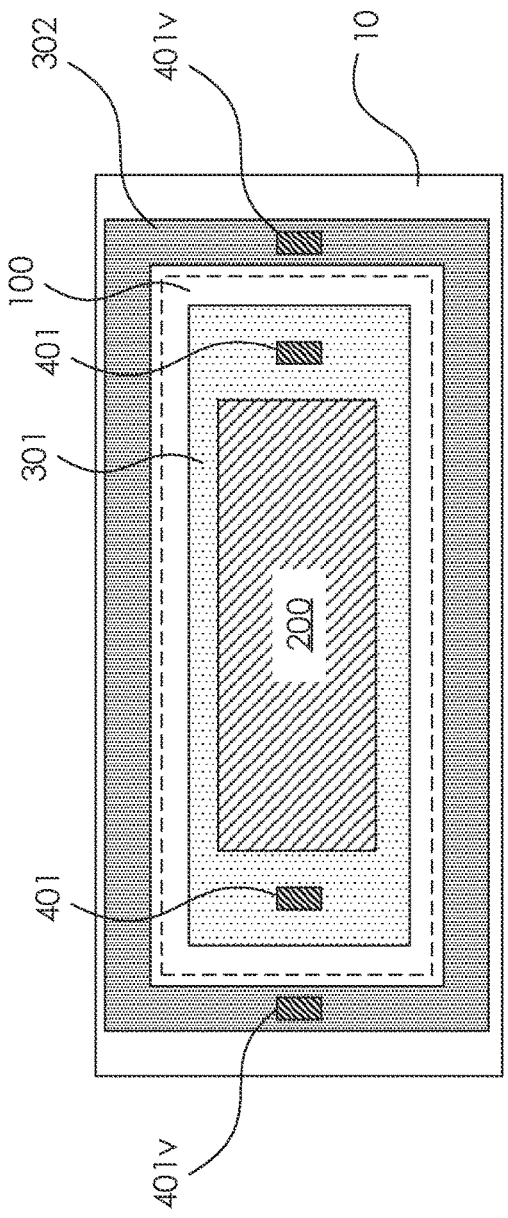
FIGS. 6B and 6C illustrate top views of a photodetecting device according to some embodiments of the present disclosure.
Figure 6C:
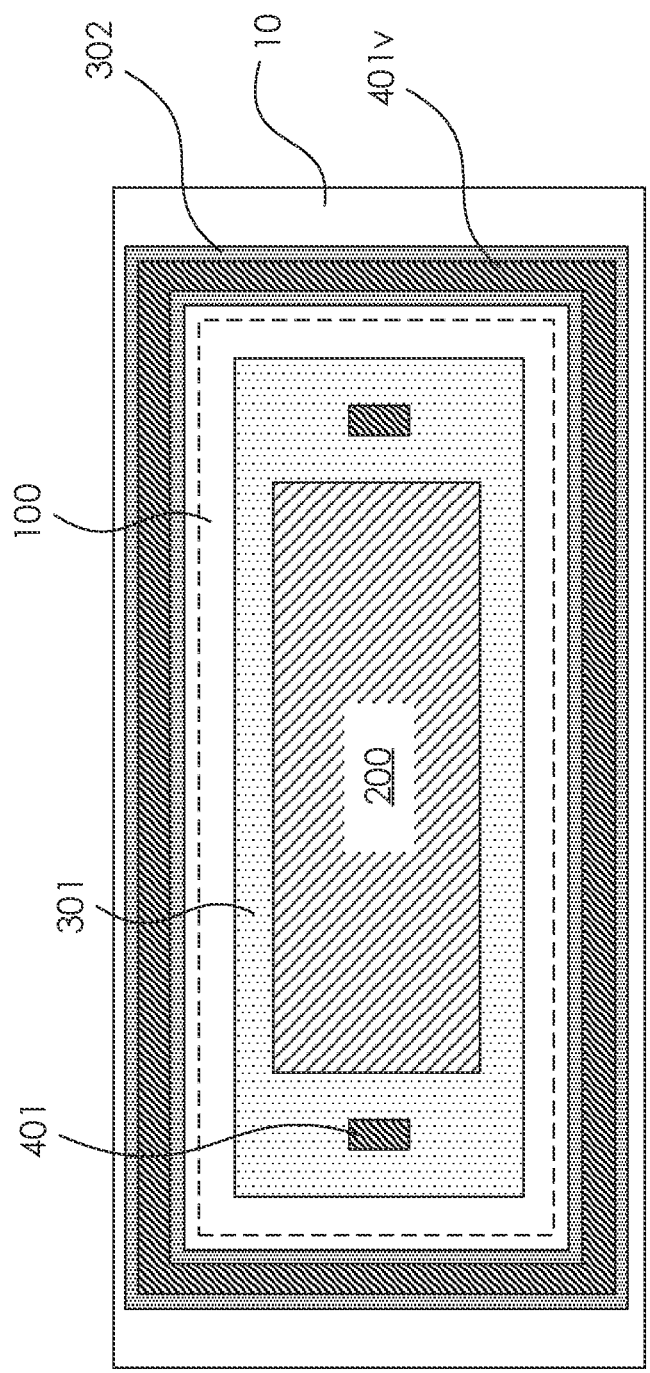

Referring to FIG. 6A, in some embodiments, the first doped region 301 may extend along a sidewall and a bottom surface of the second absorption region 200 to separate the first absorption region 100 and the second absorption region 200. In some embodiments, the first doped region 301 may include p-doped silicon and the second doped region 302 may include n-doped silicon. An area-increased first photodetecting component based on such PIN photodetector including the first doped region 301, the first absorption region 100, and the second doped region 302 may be formed. In some embodiments, in forming the first doped region 301, a recess may be formed in the substrate 10; next, the first doped region 301 may be formed at the surface of the substrate surrounding the recess by any suitable methods such as implanting dopants and then the recess may be filled by the material of the second absorption region 200 by any suitable method such as epitaxial growth. As shown in FIGS. 6B and 6C, the second doped region 302 may be formed along the periphery of the first absorption region 100 from a top view perspective. In some embodiments, the carrier control terminals 401v electrically coupled to the second doped region 302 may include two discrete conductive plugs disposed at opposite sides of the first absorption region 100 and the second absorption region 200. The aforesaid two discrete conductive plugs may further be connected to a first bias. Likewise, the carrier control terminals 401 electrically coupled to the first doped region 301 may include two discrete conductive plugs disposed at opposite sides of the first absorption region 100 and the second absorption region 200, as illustrated in FIG. 6B. The aforesaid two discrete conductive plugs may further be connected to a second bias different from the first bias. In some other embodiments, the carrier control terminals 401v may include a contiguous conductive plug electrically couple to the second doped region 302 and along the periphery of the first absorption region 100 from a top view perspective, as illustrated in FIG. 6C. In some embodiments, the second doped region 302 in FIG. 6B may be formed at two opposite sides of the first absorption region 100 from a top view perspective as shown in FIG. 7B as descried later.

Figure 7A:
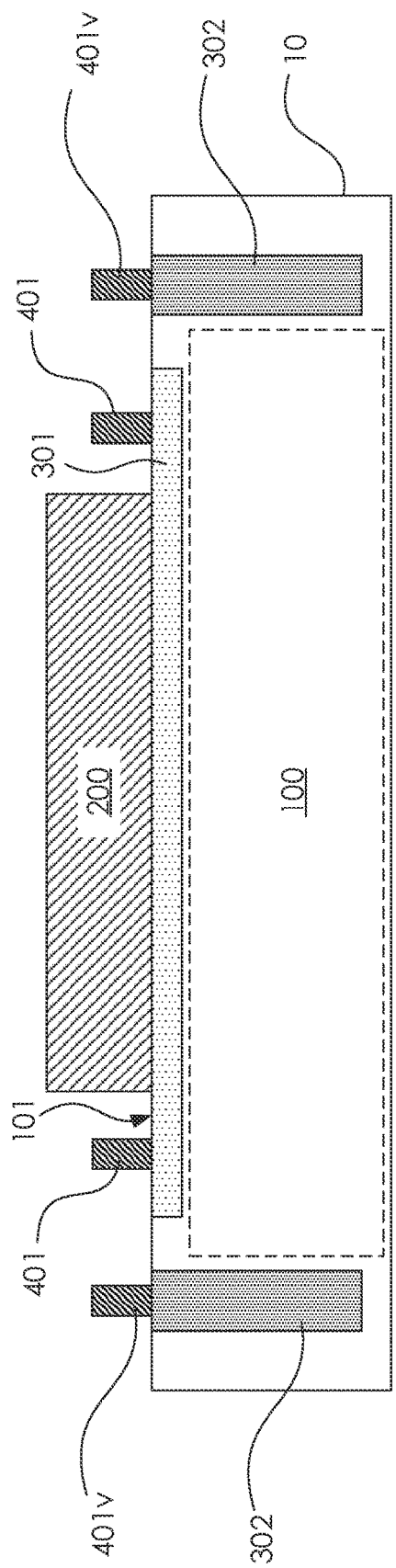
FIG. 7A illustrates a cross-sectional view of a photodetecting device according to some embodiments of the present disclosure.
Figure 7B:
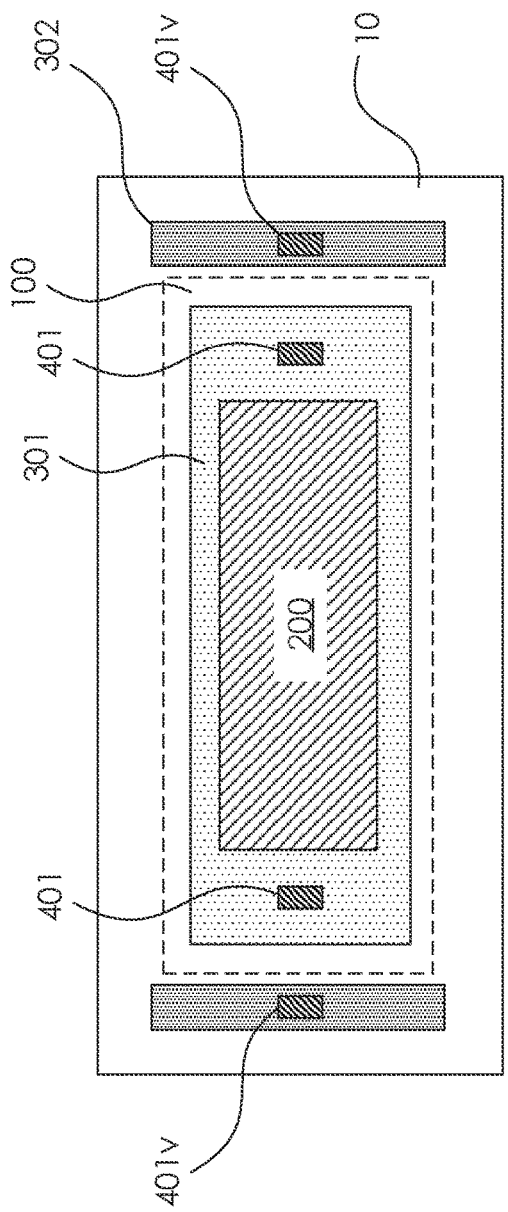
FIGS. 7B and 7C illustrate top views of a photodetecting device according to some embodiments of the present disclosure.
Figure 7C:
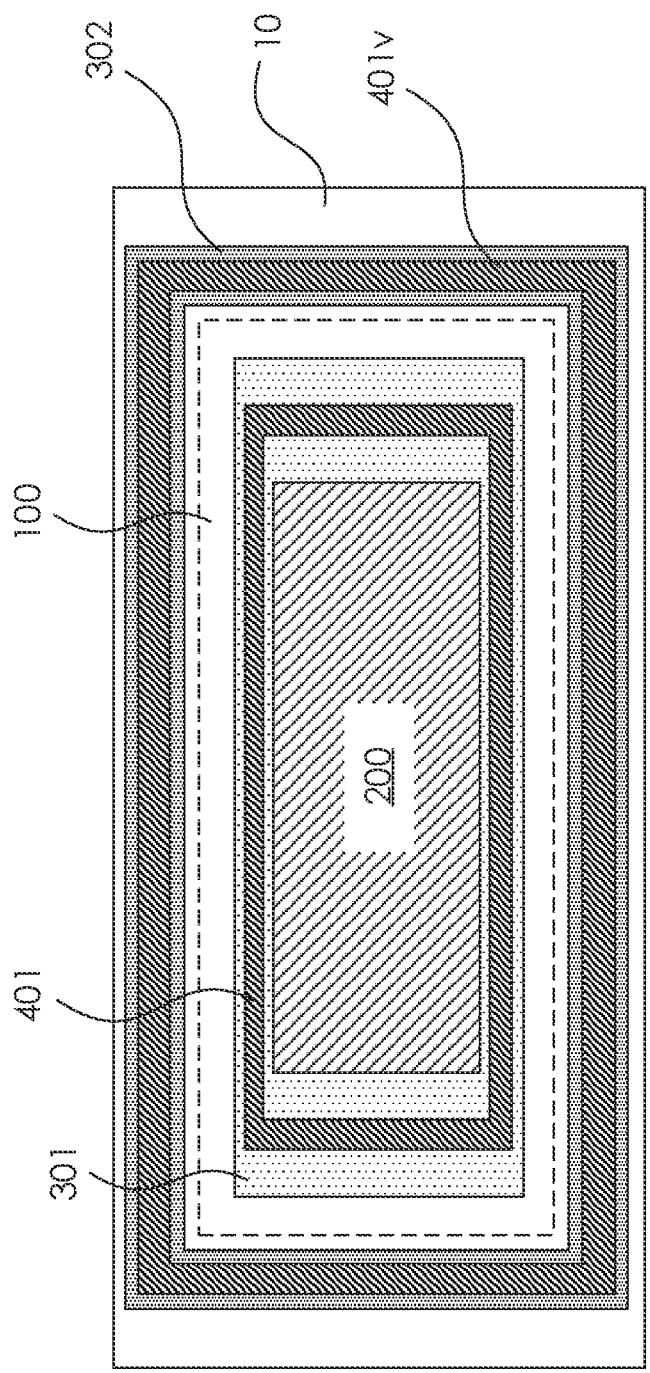

Referring to FIG. 7A, in some embodiments, the second absorption region 200 is formed over the first surface 101 of the substrate 10, and the first doped region 301 extends along a bottom surface of the second absorption region 200 to separate the first absorption region 100 and the second absorption region 200. In such embodiments, no recess needs to be formed in the substrate 10 prior to forming the first doped region 301. As shown in FIG. 7B, in some embodiments, the second doped region 302 may be formed at two opposite sides of the first absorption region 100 from a top view perspective, and the carrier control terminals 401v electrically coupled to the second doped region 302 may include two discrete conductive plugs disposed at opposite sides of the first absorption region 100. In some other embodiments, as shown in FIG. 7C, the second doped region 302 and the carrier control terminals 401v electrically couple to the second doped region 302 are both formed along the periphery of the first absorption region 100 and are both contiguous from a top view perspective.

Figure 8:
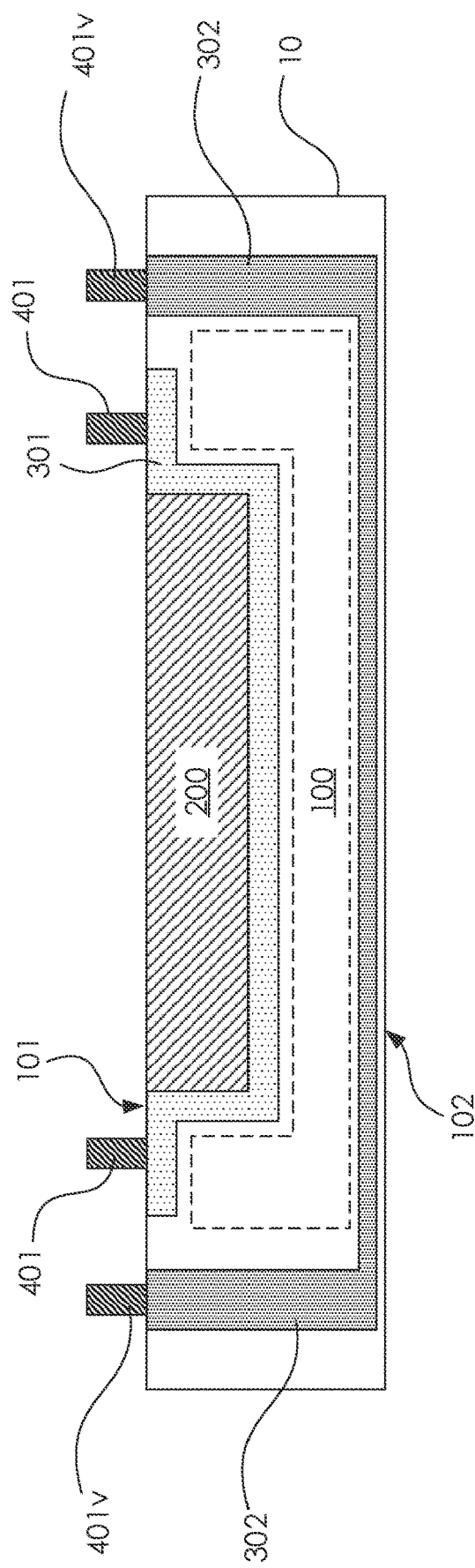
FIG. 8 illustrates a cross-sectional view of a photodetecting device according to some embodiments of the present disclosure.
Figure 9:
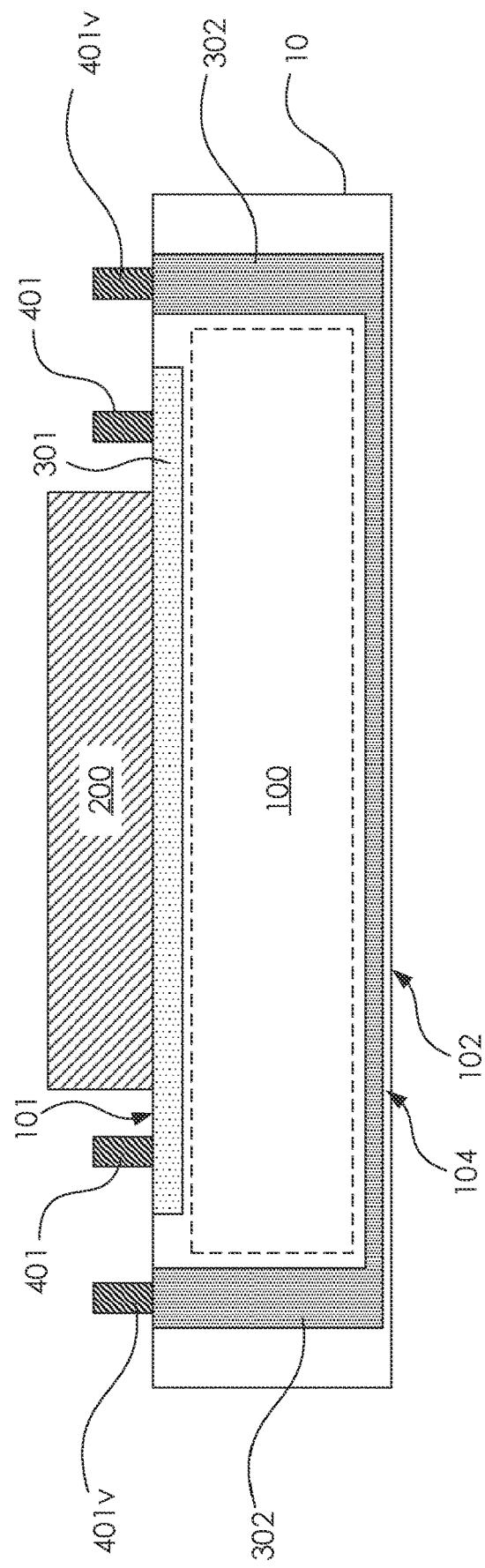
FIG. 9 illustrates a cross-sectional view of a photodetecting device according to some embodiments of the present disclosure.

Referring to FIG. 8, in some embodiments, the second doped region 302 may be a contiguous region in any suitable form. For example, the second doped region 302 may include a vertical portion and a horizontal portion extending in proximity across the second surface 102 of the substrate 10. The first absorption region 100 is sandwiched by the first doped region 301 and the second doped region 302. The photodetecting device of FIG. 9 is similar to that of FIG. 8 except that the second absorption region 200 is on the first surface 101 of the substrate 10 and the shape of the first absorption region 100 is different from the shape of the first absorption region 100 in FIG. 8.

In some embodiments, the first photodetecting component in the photodetecting device from FIG. 3A through FIG. 9 may be a CMOS image sensor. In some embodiments, the first photodetecting component is operated at a frame rate not more than 1000 frames per second (fps).

Figure 10A:
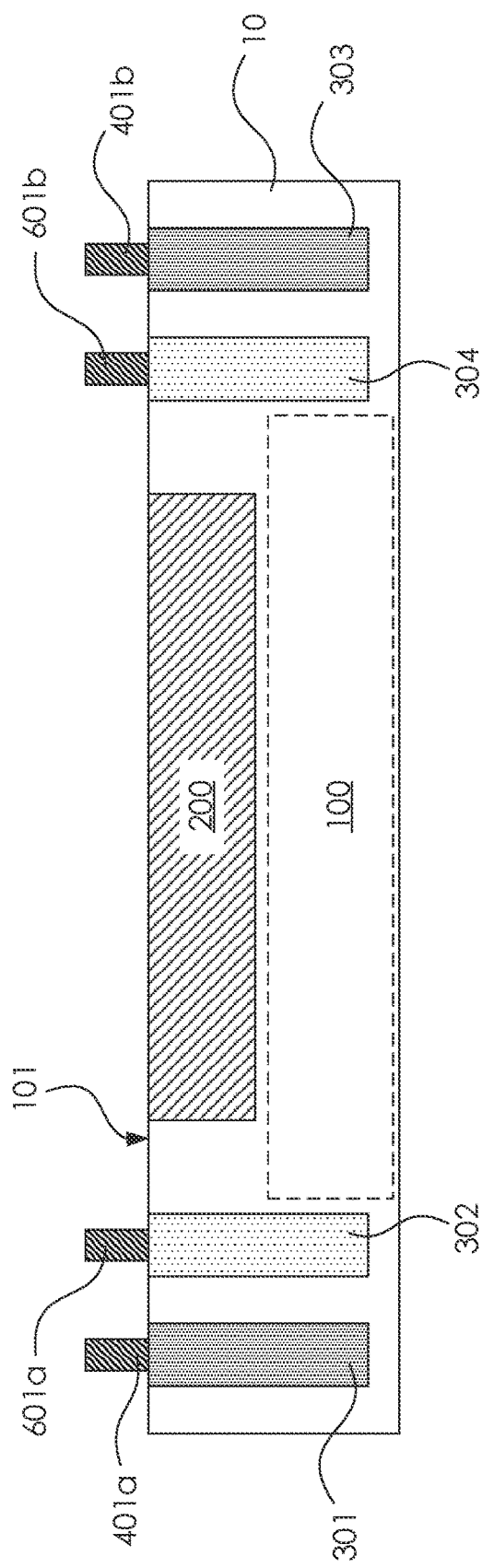
FIG. 10A illustrates a cross-sectional view of a photodetecting device according to some embodiments of the present disclosure.

Referring to FIG. 10A, in some embodiments, the first photodetecting component further includes a third doped region 303 of the first conductivity type in the substrate 10, wherein the first doped region 301 and the third doped region 303 are disposed at opposite sides of the first absorption region 100 and the second absorption region 200. In such embodiments, the first photodetecting component also includes a fourth doped region 304 of the second conductivity type in the substrate 10, wherein the second doped region 302 and the fourth doped region 304 are disposed at opposite sides of the first absorption region 100 and the second absorption region 200. As shown in FIG. 10A, in such embodiments, carrier control terminals 601a and 601b may be connected to two first control circuits in a one-to-one correspondence. Carrier control terminals 401a and 401b may be connected to two first readout circuits in a one-to-one correspondence for the first photo-carriers generated in the first absorption region 100. In some embodiments, the first readout circuit electrically connected to the carrier control terminals 401a is separated from the first readout circuit electrically connected to the carrier control terminals 401b. The two first control circuits are electrically coupled to the second doped region 302 and the fourth doped region 304 through the carrier control terminals 601a and 601b, respectively, whereas the two first readout circuits are electrically coupled to the first doped region 301 and the third doped region 303 through the carrier control terminals 401a and 401b, respectively. In some embodiments, the first doped region 301 and the third doped region 303 are n-doped and the second doped region 302 and the fourth doped region 304 are p-doped. In some embodiments, the second doped regions 302 and the fourth doped region 304 are closer to the first absorption region 100 than the first doped region 301 and the third doped region 303 do. In some embodiments, the carrier control terminals 401a, 401b, 601a and 601b include a material similar to the material of the carrier control terminals 401/401v as described in FIGS. 3A to 3C.

In some embodiments, the third doped region 303 includes a dopant having a peak concentration higher than a peak concentration of a dopant of the substrate 10. In some embodiments, the substrate 10 may be intrinsic. In some embodiments, the peak concentration of the dopant of the third doped region 303 is in a range of from about 5E18 cm$^{-3}$ to about 5E20 cm$^{-3}$ to allow an Ohmic contact to be formed between the carrier control terminal 401b and the third doped region 303. For instance, the third doped region 303 may have an n+ doping, where the activated dopant concentration may be as high as a manufacturing operation may achieve. In some embodiments, the doping concentration of the n-doped third doped region 303 may be lower than about 5E20 cm$^{-3}$ to ease the manufacturing complexity. In some embodiments, the fourth doped region 304 includes a dopant having a peak concentration higher than a peak concentration of a dopant of the substrate 10. In some embodiments, the substrate 10 may be intrinsic. In some embodiments, the fourth doped region 304 may have a p+ doping, where the activated dopant concentration may be as high as a manufacturing operation may achieve. In some embodiments, the doping concentration of the p-doped fourth doped region 304 may be lower than about 5E20 cm$^{-3}$ to ease the manufacturing complexity. Similarly, in some embodiments, the fourth doped region 304 includes a dopant having a peak concentration in a range of from about 5E18 cm$^{-3}$ to about 5E20 cm$^{-3}$ to allow an Ohmic contact to be formed between the carrier control terminal 601b and the fourth doped region 304.

The two first control circuits may provide control signals to control the collection of photo-carriers, for example, electrons, generated by the absorbed photons in the first absorption region 100. For example, referring to FIG. 10A, when the first control circuit electrically connected to the carrier control terminal 601a is biased against the first control circuit electrically connected to the carrier control terminal 601b, an electric field is created between the second doped region 302 and the fourth doped region 304, and free electrons may drift towards the second doped region 302 or the fourth doped region 304 depending on the direction of the electric field. The electric field between the second doped region 302 and the first doped region 301 further guides the electrons to the first doped region 301. The first readout circuit electrically connected to the carrier control terminals 401a may then be enabled to process the electrons collected by the first doped region 301. In some embodiments, the first control circuit electrically connected to the carrier control terminal 601a may be fixed at a voltage value Vi, and the other first control circuit electrically connected to the carrier control terminal 601b may alternate between voltage values Vi±ΔV. The direction of the bias value determines the drift direction of the electrons. Accordingly, when a switch including the first readout circuit electrically connected to the carrier control terminal 401a and the first control circuit electrically connected to the carrier control terminal 601a is switched "on" (i.e., the electrons drift towards the second doped region 302), the other switch including the first readout circuit electrically connected to the carrier control terminal 401b and the first control circuit electrically connected to the carrier control terminal 601b is switched "off" (i.e., the electrons are blocked from the fourth doped region 304). In some embodiments, the two first control circuits electrically connected to the carrier control terminals 601a and 601b respectively may be applied to voltages that are differential to each other. In some embodiments, the first control circuit electrically connected to the carrier control terminal 601a is a fixed at a voltage value V (e.g., 0.5V) and the first control circuit electrically connected to the carrier control terminal 601b is a varying voltage signal (e.g., sinusoid signal, clock signal or pulse signal operated at 0V or 1V). In some embodiments, each of the first control circuits includes a voltage source. In some embodiments, a phase of a signal from the voltage source in one of the first control circuits is different, for example, opposite from a phase of a signal form the voltage source in the other first control circuit.

Figure 10B:
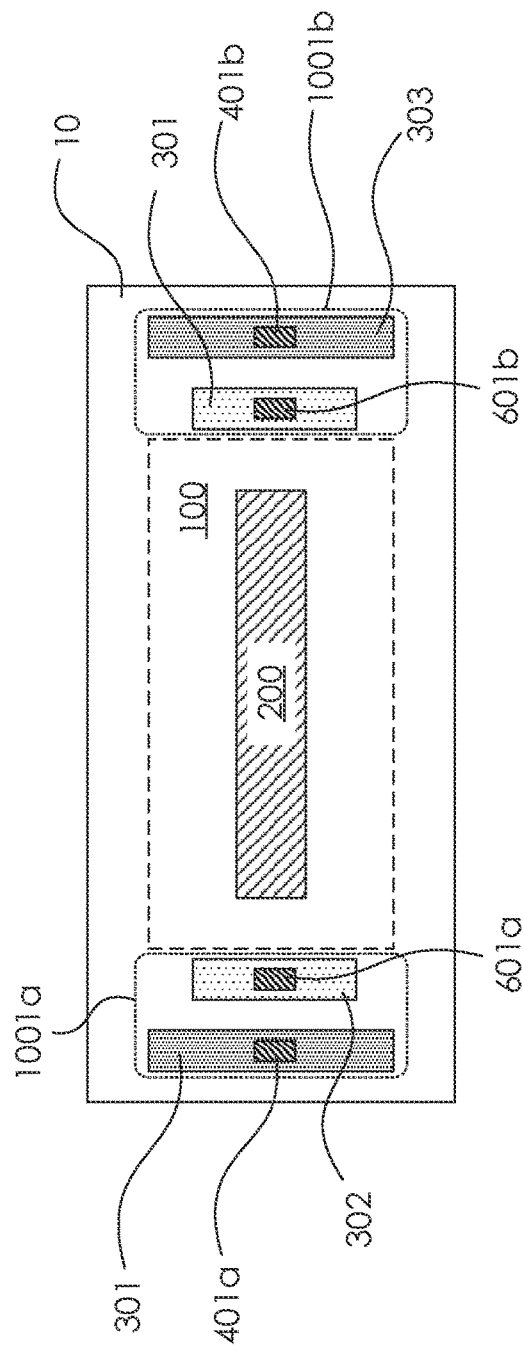
FIG. 10B illustrates a top view of a photodetecting device according to some embodiments of the present disclosure.

FIG. 10B illustrates the photodetecting device from a top view perspective. The photodetecting device includes a first switch 1001a at the left side of the first absorption region 100, and a second switch 1001b at the right side of the first absorption region 100. The first photo-carriers generated in the first absorption region 100 may be collected by suitable time modulation between the first switch 1001a and the second switch 1001b. In some embodiments, the first photodetecting component in FIG. 10A may be a Time of Flight (TOF) photodetector. Referring to FIG. 10B, in some embodiments, the two first control circuits electrically connected to the carrier control terminals 601a and 601b are electrically coupled to the second doped region 302 and the fourth doped region 304, respectively, the carrier control terminals 601a and 601b are two discrete conductive plugs disposed at opposite sides of the first absorption region 100 and the second absorption region 200. The carrier control terminals 401a and 401b electrically coupled to the first doped region 301 and the third doped region 303 respectively may be two discrete conductive plugs disposed at opposite sides of the first absorption region 100 and the second absorption region 200. The two first readout circuits may be similar to the readout circuit as described in FIGS. 3A to 3C. For example, each of the two first readout circuits may include a reset gate, a source-follower, and a selection gate for processing the carriers collected by the first doped region 301 and the third doped region 303 respectively.

Figure 10C:
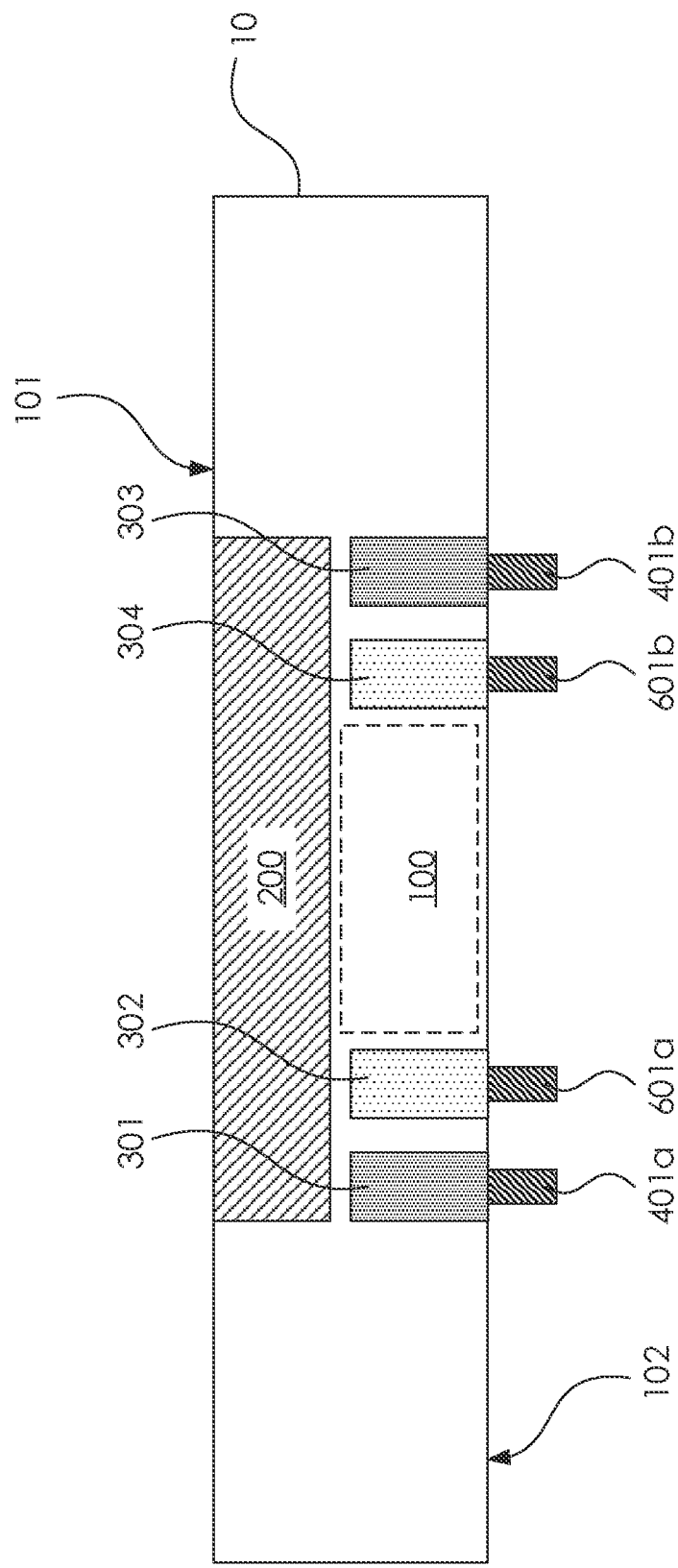
FIG. 10C illustrates a cross-sectional view of a photodetecting device according to some embodiments of the present disclosure.

As shown in FIG. 10C, in some embodiments, the second absorption region 200 may be fully embedded in the substrate 10 and proximity to the first surface 101. In some embodiments, the doped regions 301, 302, 303, and 304 are all in contact with the second surface 102 of the substrate 10. In some embodiments, the doped regions 301, 302, 303, and 304 may overlap with the second absorption region 200 in a vertical direction. In other words, those doped regions 301, 302, 303, and 304 are under a vertical projection of the second absorption region 200. Although not illustrated in FIG. 10C, in some embodiments, the second absorption region 200 may be narrower than the first absorption region 100.

Figure 11A:
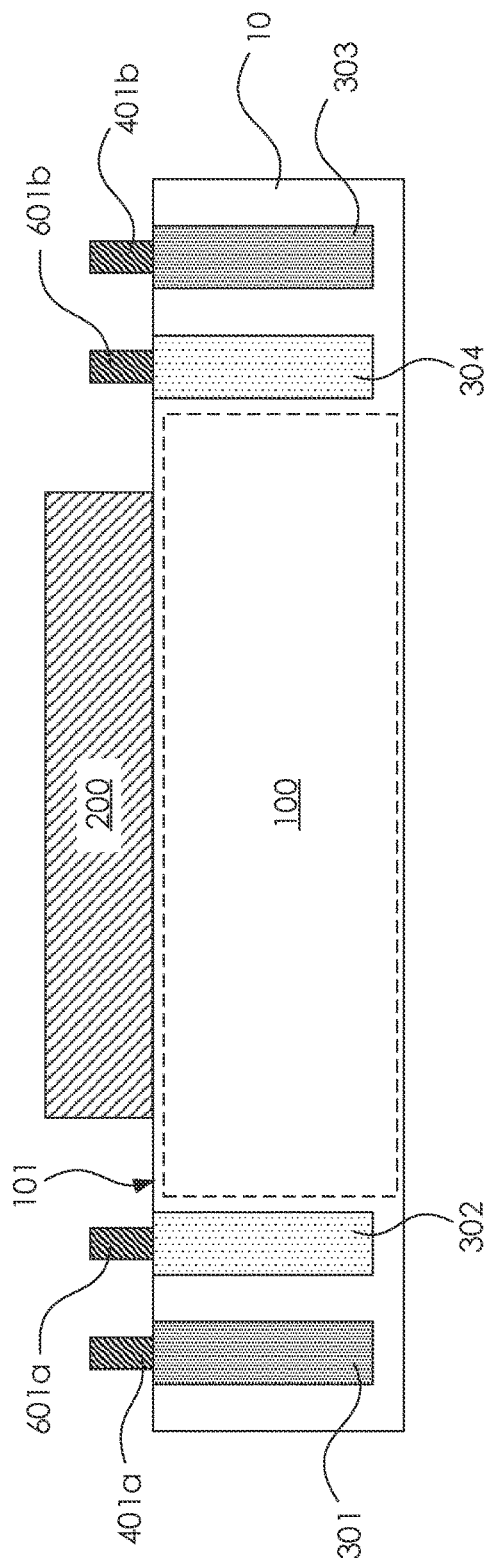
FIGS. 11A and 11B illustrate cross-sectional views of a photodetecting device according to some embodiments of the present disclosure.
Figure 11B:
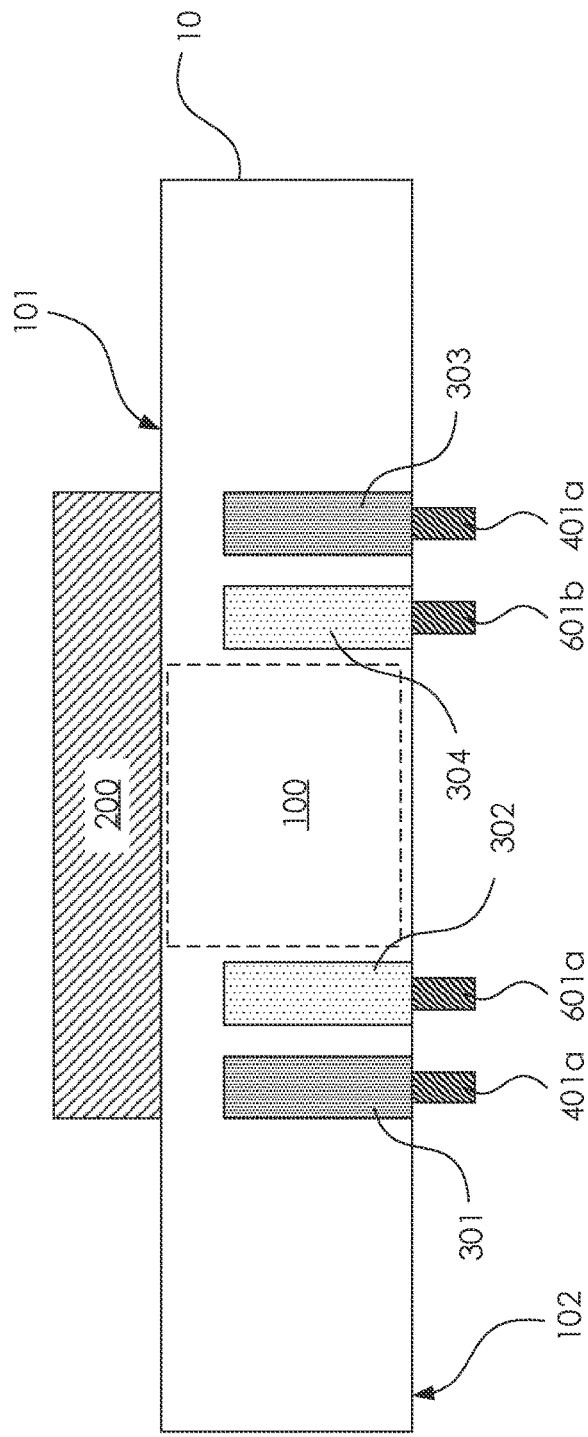
Figure 12A:
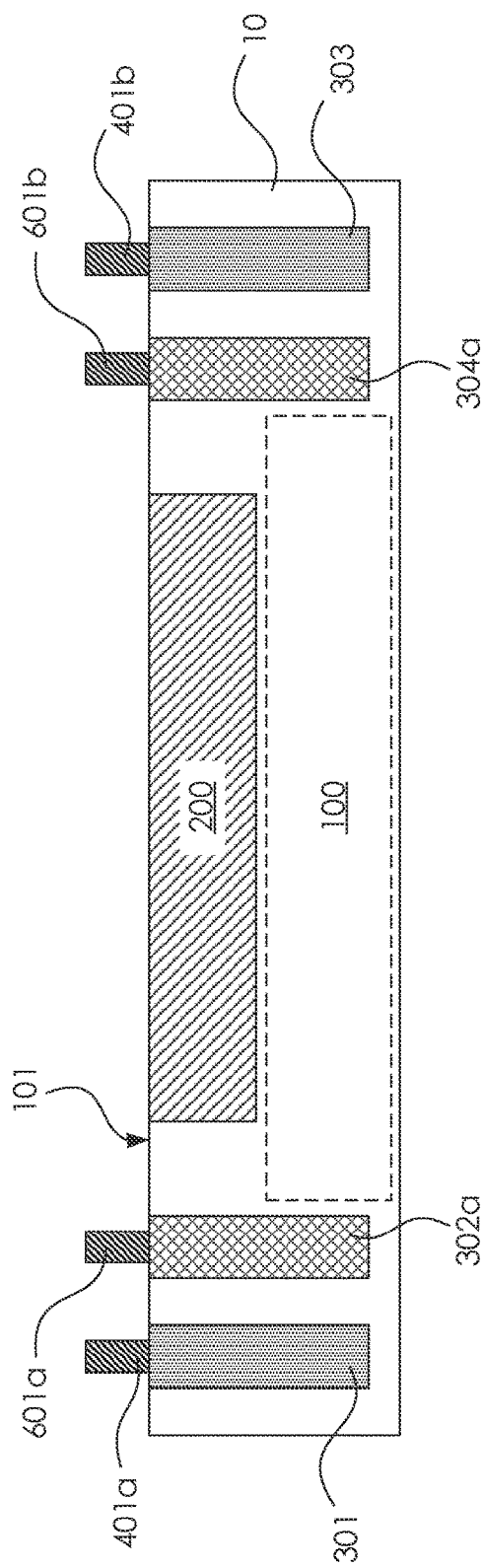
FIGS. 12A and 12B illustrate cross-sectional views of a photodetecting device according to some embodiments of the present disclosure.
Figure 12B:
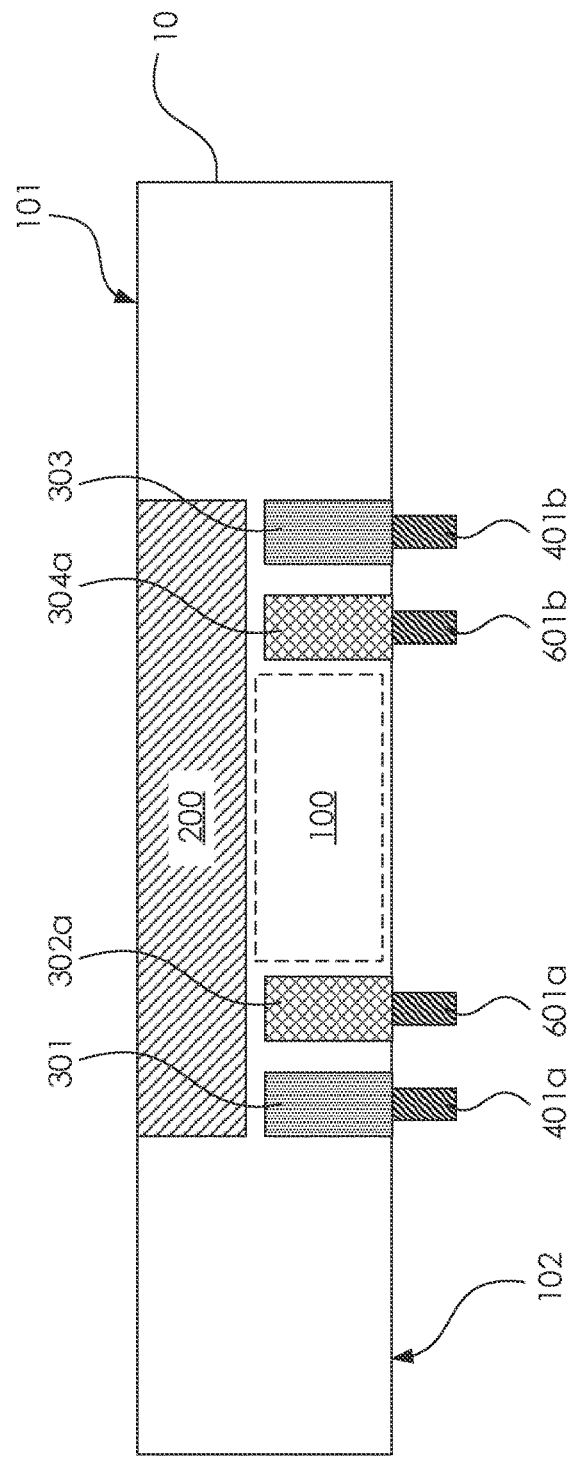
Figure 13A:
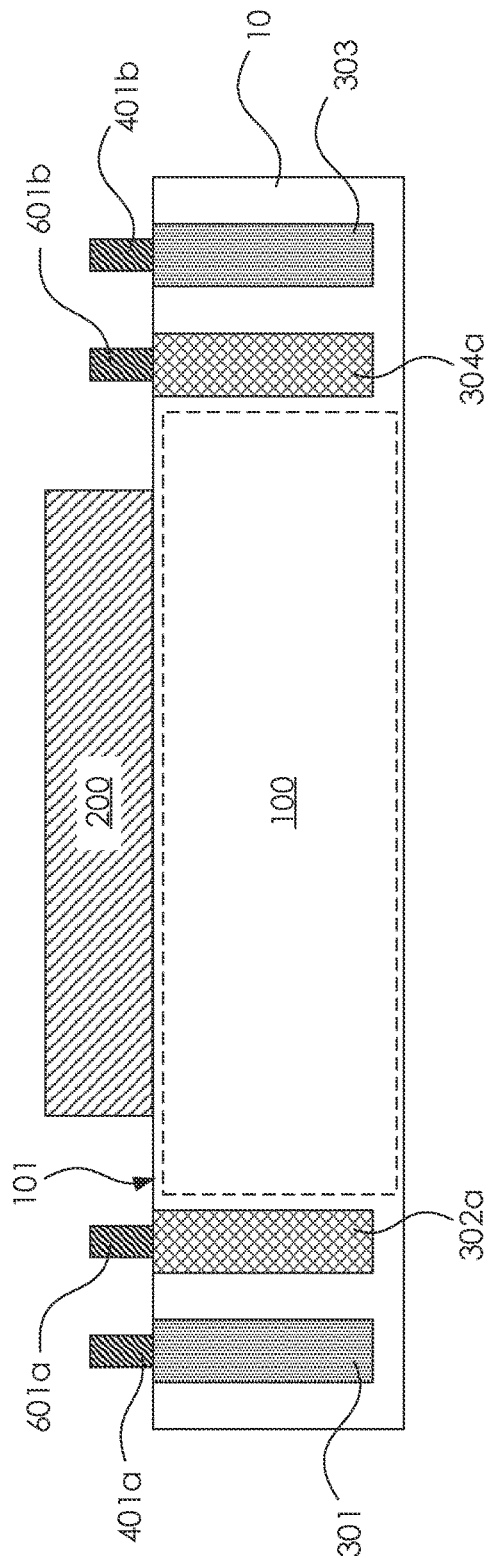
FIGS. 13A and 13B illustrate cross-sectional views of a photodetecting device according to some embodiments of the present disclosure.
Figure 13B:
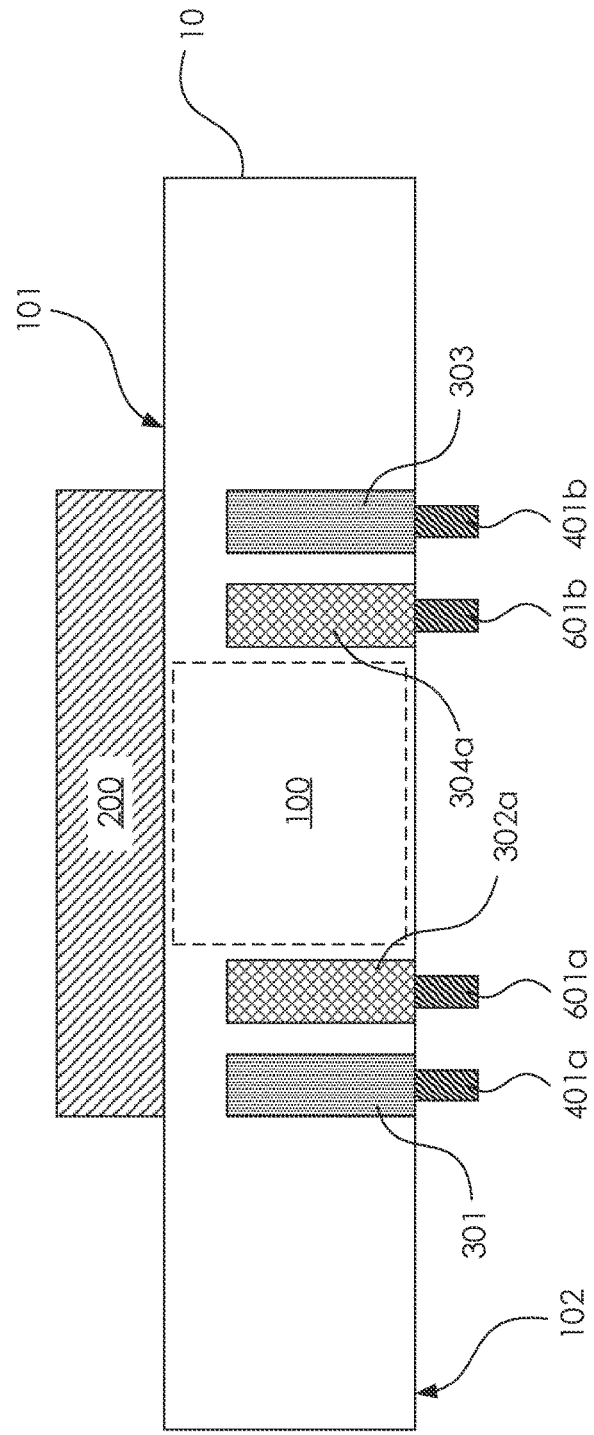

Similar with the embodiments shown in FIGS. 10A and 10C, in some embodiments, the second absorption region 200 may be formed over the first surface 101 of the substrate 10, as shown in FIGS. 11A and 11B. Description of FIGS. 11A and 11B may be referred to paragraphs addressing FIGS. 10A and 10C, and is omitted here for brevity.

Referring to FIGS. 12A, 12B, 13A and 13B, in some embodiments, the second doped region 302 and the fourth doped region 304 previously described in FIG. 10A may be replaced by lightly-doped regions 302a and 304a, or intrinsic regions described herein. The embodiments of FIGS. 12A, 12B, 13A and 13B illustrate that the second absorption region 200 may be formed over the substrate 10 or embedded in the substrate 10. In some embodiments, the doped regions 301, 302, 303, and 304 may be overlapped with the second absorption region 200. In some embodiments, the peak concentration of the lightly-doped regions 302a and 304a, or intrinsic regions, may be lower than about 10E17 cm$^{-3}$. In some embodiment, the lightly-doped regions 302a and 304a or intrinsic regions form a Schottky junction to the carrier control terminals 601a and 601b respectively. The dopants in the lightly-doped regions 302a and 304a may be the first conductivity type or the second conductivity type, depending on the conductivity types of the first doped region 301 and the third doped region 303. In some embodiments, the conductivity type of the lightly-doped regions 302a and 304a are different from the conductivity types of the first doped region 301 and the third doped region 303. For example, if the first doped region 301 and the third doped region 303 are of n-type, the lightly-doped regions 302a and 304a may be lightly p-doped.

Figure 14:
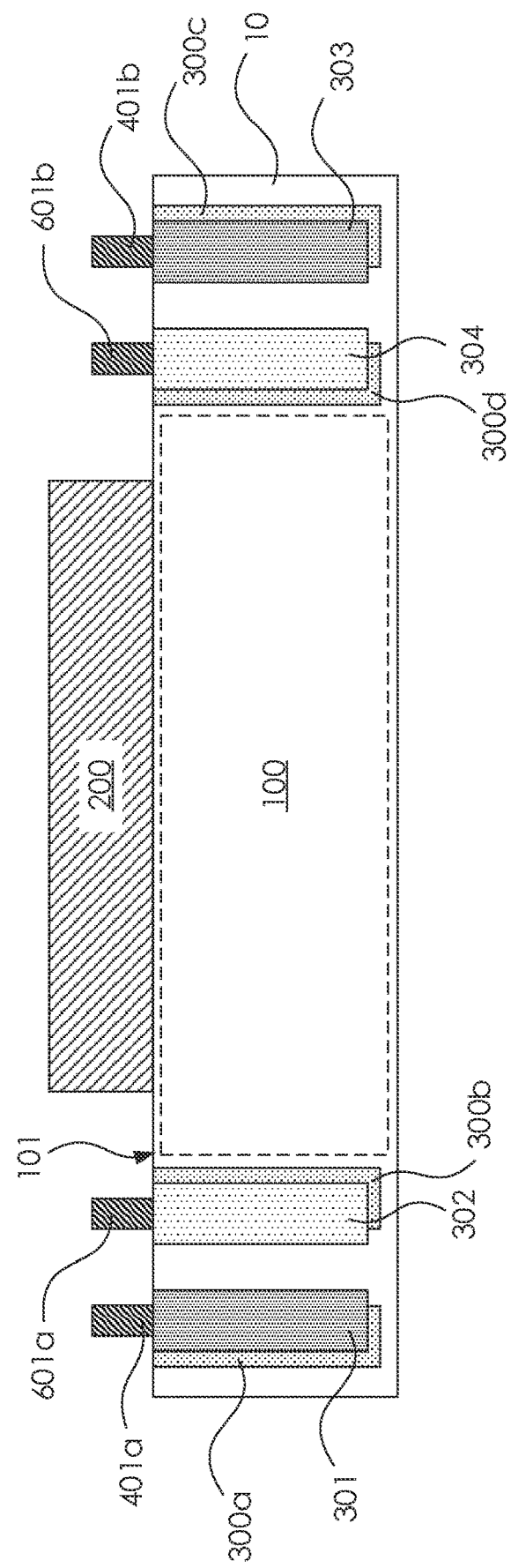
FIG. 14 illustrates a cross-sectional view of a photodetecting device according to some embodiments of the present disclosure.

As shown in FIG. 14, in some embodiments, the first photodetecting component further includes a plurality of first well regions 300a, 300b, 300c, and 300d surrounding the doped regions 301, 302, 303, and 304, respectively. Such first well regions may reduce the leakage current and/or the dark current of the first photodetecting component. In some embodiments, the first well regions 300a, 300b, 300c, and 300d may partially surround each of the doped regions 301, 302, 303, and 304, as shown in FIG. 14. Although not illustrated in FIG. 14, in some other embodiments, the first well regions (300a, 300b, 300c, and 300d) may surround each of the doped regions (301, 302, 303, and 304) entirely, that is, surrounding all lateral sides and the bottom of each of the doped regions 301, 302, 303, and 304.

In some embodiments, the first doped region 301 is of a conductivity type different from a conductivity type of the first well region 300a. The second doped region 302 is of a conductivity type different from the conductivity type of the first well region 300b. The third doped region 303 is of a conductivity type different from the conductivity type of the first well region 300c. The fourth doped region 304 is of a conductivity type different from the conductivity type of the first well region 300d.

In some embodiments, the peak concentrations of the dopants in the first well regions 300b and 300d are lower than the peak concentrations of the dopant in the second doped region 302 and the fourth doped region 304, respectively. In some embodiments, the peak concentrations of the dopants in each of the first well regions 300b and 300d may be in a range from about 10E15 cm$^{-3}$ to about 10E17 cm$^{-3}$. In some embodiments, the peak concentrations of the dopant in the first well regions 300a and 300c are lower than the peak concentrations of the dopants in the first doped region 301 and the third doped region 303, respectively. In some embodiments, the peak concentration of the dopant in each of the first well regions 300a and 300c may be in a range from about 10E15 cm$^{-3}$ to about 10E17 cm$^{-3}$. The above-mentioned descriptions disclose the structure of the first photodetecting component. In some embodiments, the second photodetecting component including the second absorption region 200 also includes the doped regions and the circuits coupled to the doped regions, and the second photodetecting component is also configured to convert an optical signal to an electrical signal. Therefore, by vertically integrating absorption regions made by different materials, such as germanium and silicon, the photodetecting device may operate at two different modulation frequencies and improve accuracy and dealiasing ability.

Figure 15A:
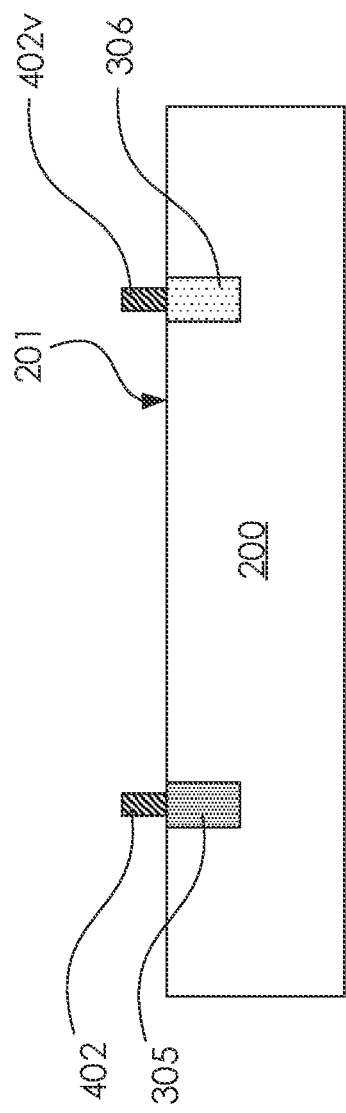
Figure 15B:
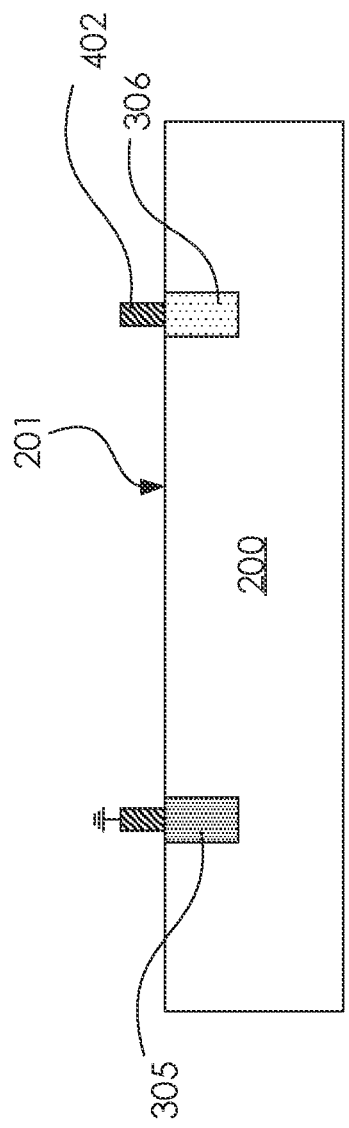

Referring to FIGS. 15A and 15B, the second photodetecting component may be used as a CMOS image sensor which includes a fifth doped region 305 of the first conductivity type in the second absorption region 200. The fifth doped region 305 is in contact with a surface 201 of the second absorption region 200. The second photodetecting component further includes a sixth doped region 306 of the second conductivity type in the second absorption region 200. The sixth doped region 306 is in contact with the surface 201 of the second absorption region 200. In such embodiments, carrier control terminals 402 connects the fifth doped region 305 and a second readout circuit for processing the second photo-carriers generated in the second absorption region 200. The second readout circuit may be separated from the first readout circuits such that the first photo-carriers and the second photo-carriers are processed by the first readout circuit and the second readout circuit respectively. In some embodiments, the fifth doped region 305 or the sixth doped region 306 may be coupled to a voltage source or a ground through a carrier control terminal 402v or 402, depending on the operation conditions. For instance, in the case of the second photodetecting component is designed to process holes in the second photo-carriers generated in the second absorption region 200, for example, as shown in FIG. 15A, the second readout circuit is electrically coupled to the fifth doped region 305 (e.g., p-doped) through the carrier control terminal 402, and a $V_{DD}$, may be applied to the sixth doped region 306 (e.g., n-doped) to through the carrier control terminal 402v to evacuate electrons. In the case of the second photodetecting component is designed to process electrons, as shown in FIG. 15B, the second readout circuit 402 electrically coupled to the sixth doped region 306 (e.g., n-doped) through the carrier control terminal 402 and the fifth doped region 305 (e.g., p-doped) may be grounded to evacuate holes.

Referring to FIGS. 15C to 15F, the second photodetecting component may be used as a TOF sensor which further includes a seventh doped region 307 of the first conductivity type and an eighth doped region 308 of the second conductivity type proximal to a side of the second absorption region 200, whereas the fifth doped region 305 and the sixth doped region 306 proximal to another side of the second absorption region 200. In some embodiments, the sixth doped region 306 and the eighth doped region 308 are between the fifth doped region 305 and the seventh doped region 307.

In some embodiments, the fifth doped region 305 includes a dopant having a peak concentration higher than a peak concentration of a dopant of the second absorption region 200. In some embodiments, the second absorption region 200 may be intrinsic. In some embodiments, the second absorption region 200 including intrinsic germanium is of p-type due to material defects formed during formation of the second absorption region 200, wherein the defect density is from 10E13 $cm^{-3}$ to 10E15 $cm^{-3}$. In some embodiments, the peak concentration of the dopant of the fifth doped region 305 is in a range of from about 5E18 $cm^{-3}$ to about 5E20 $cm^{-3}$ to allow an Ohmic contact to be formed between the carrier control terminal 402a and the fifth doped region 305. For instance, the fifth doped region 305 may have an n+ doping, where the activated dopant concentration may be as high as a manufacturing operation may achieve. In some embodiments, the doping concentration of the n-doped fifth doped region 305 may be lower than about 5E20 $cm^{-3}$ to ease the manufacturing complexity. In some embodiments, the sixth doped region 306 includes a dopant having a peak concentration higher than a peak concentration of a dopant of the second absorption region 200. In some embodiments, the second absorption region 200 may be intrinsic. In some embodiments, the sixth doped region 306 may have a p+ doping, where the activated dopant concentration may be as high as a manufacturing operation may achieve. In some embodiments, the doping concentration of the p-doped sixth doped region 306 may be lower than about 5E20 $cm^{-3}$ to ease the manufacturing complexity. Similarly, in some embodiments, the sixth doped region 306 includes a dopant having a peak concentration in a range of from about 5E18 $cm^{-3}$ to about 5E20 $cm^{-3}$ to allow an Ohmic contact to be formed between the carrier control terminal 602a and the sixth doped region 306.

In some embodiments, the seventh doped region 307 includes a dopant having a peak concentration higher than a peak concentration of a dopant of the second absorption region 200. In some embodiments, the second absorption region 200 may be intrinsic. In some embodiments, the second absorption region 200 including intrinsic germanium is of p-type due to material defects formed during formation of the second absorption region 200, wherein the defect density is from 10E13 $cm^{-3}$ to 10E15 $cm^{-3}$. In some embodiments, the peak concentration of the dopant of the seventh doped region 307 is in a range of from about 5E18 $cm^{-3}$ to about 5E20 $cm^{-3}$ to allow an Ohmic contact to be formed between the carrier control terminal 402b and the seventh doped region 307. For instance, the seventh doped region 307 may have an n+ doping, where the activated dopant concentration may be as high as a manufacturing operation may achieve. In some embodiments, the doping concentration of the n-doped seventh doped region 307 may be lower than about 5E20 $cm^{-3}$ to ease the manufacturing complexity. In some embodiments, the eighth doped region 308 includes a dopant having a peak concentration higher than a peak concentration of a dopant of the second absorption region 200. In some embodiments, the second absorption region 200 may be intrinsic. In some embodiments, the eighth doped region 308 may have a p+ doping, where the activated dopant concentration may be as high as a manufacturing operation may achieve. In some embodiments, the doping concentration of the p-doped eighth doped region 308 may be lower than about 5E20 $cm^{-3}$ to ease the manufacturing complexity. Similarly, in some embodiments, the eighth doped region 308 includes a dopant having a peak concentration in a range of from about 5E18 $cm^{-3}$ to about 5E20 $cm^{-3}$ to allow an Ohmic contact to be formed between the carrier control terminal 602b and the eighth doped region 308.

In such embodiments, the second photodetecting component further includes two second control circuits electrically connected to the carrier control terminals 602a and 602b respectively for the second photo-carriers generated in the second absorption region 200. The two second control circuits are electrically coupled to the sixth doped region 306 and the eighth doped region 308, through the carrier control terminals 602a and 602b, respectively. In addition, two second readout circuits for processing the second photo-carriers generated in the second absorption region 200 are electrically coupled to the fifth doped region 305 and the seventh doped region 307, through the carrier control terminals 402a and 402b, respectively. In some embodiments, each of the second control circuits includes a voltage source. In some embodiments, a phase of a signal from the voltage source in one of the second control circuits is different, for example, opposite from a phase of a signal form the voltage source in the other second control circuit. The description of the second readout circuits and the second control circuits may refer to the first readout circuits and the first control circuits for the first photo-carriers generated in the first absorption region 100, as disclosed in FIG. 10A, and is omitted here for brevity.

In some embodiments, as shown in FIGS. 15D to 15F, the second photodetecting component further includes a plurality of second well regions 309a, 309b, 309c, and 309d surrounding the doped regions 305, 306, 307, and 308, respectively. Such plurality of second well regions 309a, 309b, 309c, and 309d may reduce the leakage current and/or the dark current of the second photodetecting component. In some other embodiments, as shown in FIG. 15D, two of the doped regions 306 and 308 are surrounded by the second well regions 309b and 309d for reducing the leakage current between the doped regions 306 and 308. In some other embodiments, as shown in FIG. 15F, two of the doped regions 305 and 307 are surrounded by the second well regions 309a and 309c for reducing the dark current of the second photodetecting component. In some embodiments, the second well regions 309a, 309b, 309c, and 309d may surround the doped regions 305, 306, 307, and 308 respectively, as shown in FIG. 15E, such that the second photodetecting component is with both lower dark current and lower leakage current. The features of the second well regions 309a, 309b, 309c, and 309d may refer to the features of the first well regions as disclosed in FIG. 14, for example, the conductivity type of the second well region 309a adjacent to the fifth doped region 305 is different from the first conductivity type of the fifth doped region 305.

In some embodiments, the peak concentration of the doped regions 306 and 308 may be lower than about 10E17 cm$^{-3}$ to form a Schottky junction to the carrier control terminals 602a and 602b respectively. In some embodiments, the second photodetecting component is devoid of the doped regions 306 and 308 and intrinsic regions are beneath the carrier control terminals 602a and 602b to form a Schottky junction to the carrier control terminals 602a and 602b respectively.

Referring to FIG. 15E to FIG. 15F, in some embodiments, an insulating layer (not shown) may be inserted between each of the sixth doped region 306 and the eighth doped region 308 and the carrier control terminals 602a and 602b. The insulating layer may prevent direct current conduction from the carrier control terminals 602a and 602b to the sixth doped region 306 and the eighth doped region 308, but allows an electric field to be established within the second absorption region 200 in response to an application of a voltage to the second control circuits electrically connected to the carrier control terminals 602a and 602b. The established electric field may attract or repel charge carriers within the second absorption region 200. The insulating layer may include, but is not limited to, $Si_3N_4$, SiON, $SiN_x$, $SiO_x$, $GeO_x$, $Al_2O_3$, $Y_2O_3$, $TiO_2$, $Y_2O_3$, $HfO_2$, or $ZrO_2$. In some embodiments, the first photodetecting component may also include an insulating layer between the second doped region 302 and the carrier control terminal 601a. The first photodetecting component may also include another insulating layer between the fourth doped region 304 and the carrier control terminal 601b.

Referring to FIGS. 11A, 15D and 16A, in some embodiments, the arrangements of the carrier control terminals 601a, 601b electrically connected to the two first control circuits, the arrangements of the carrier control terminals 401a, 401b electrically connected to the two first readout circuits, the arrangements of the carrier control terminals 602a, 602b electrically connected to the two second control circuits, and the arrangements of the carrier control terminals 402a, 402b electrically connected to the two second readout circuits are substantially in aligned in the same direction. In some other embodiments, referring to FIGS. 11A, 15D, and 16B, the arrangements of the carrier control terminals 601a, 601b electrically connected to the two first control circuits and the carrier control terminals 401a, 401b electrically connected to the two first readout circuits, and the arrangements of the carrier control terminals 602a, 602b electrically connected to the two second control circuits, and the carrier control terminals 402a, 402b electrically connected to the two second readout circuits can be aligned in different directions, for example, in an orthogonal arrangement.

Figure 16C:
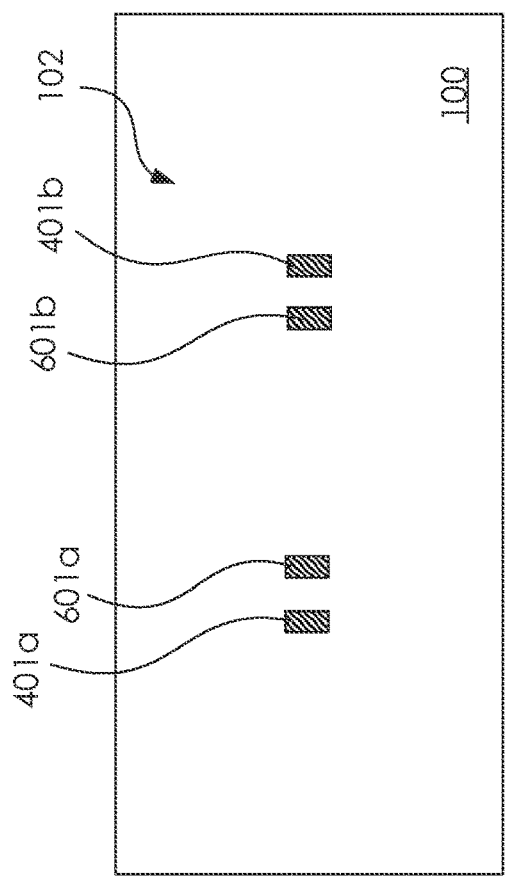
Figure 16D:
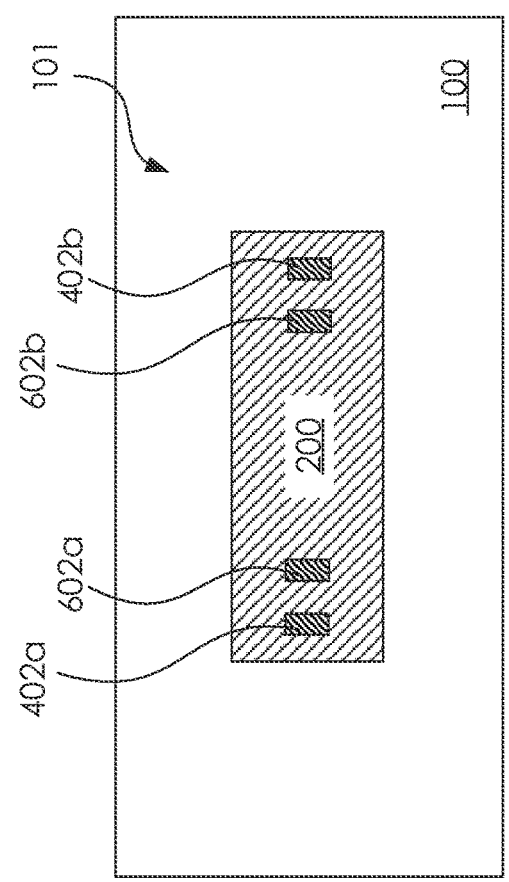
FIG. 16D illustrates a bottom view of a photodetecting device according to some embodiments of the present disclosure.

FIGS. 16C and 16D shows a photodetecting device from a top view and a bottom view, respectively. FIG. 16C shows the carrier control terminals 402a, 402b, 602a, and 602b coupled to the second absorption region 200 are disposed over the first surface 101 of the substrate 10. FIG. 16D shows the carrier control terminals 401a, 401b, 601a, and 601b coupled to the first absorption region 100 are disposed over the second surface 102 of the substrate 10. In other words, the carrier control terminals 402a, 402b, 602a, and 602b coupled to the second absorption region 200 and the carrier control terminals 401a, 401b, 601a, and 601b coupled to the first absorption region 100 are at two opposite sides of the substrate 10. In some embodiments, the carrier control terminals 402a, 402b 602a, and 602b coupled to the second absorption region 200 and over the first surface 101 may be free from overlapping with the carrier control terminals 401a, 401b, 601a, and 601b coupled to the first absorption region 100 over the second surface 102 of the substrate 10.

Referring to FIG. 16E, in some embodiments, the pixel density of a photodetecting device may be increased by arranging adjacent pixels to be orthogonal to each other. The average area per pixel can be decreased by using the orthogonal arrangement depicted in FIG. 16E. As shown in FIG. 16E, the carrier control terminals 601a, 601b, 401a, and 401b over the first absorption region 100 and the carrier control terminals 402a, 402b, 602a, and 602b over the second absorption region 200 are aligned in the different directions, for example, in an orthogonal arrangement. Moreover, the carrier control terminals 601a, 601b, 401a, and 401b coupled to the first absorption region 100 and the carrier control terminals 402a, 402b, 602a, and 602b coupled to the second absorption region 200 are disposed on opposite surfaces of the substrate 10. The carrier control terminals 601a, 601b, 401a, and 401b depicted in dotted lines refer to the elements disposed at the second surface 102 of the substrate 10. The carrier control terminals 402a', 402b', 602a', and 602b' over the second absorption region 200' in an adjacent pixel and the carrier control terminals 402a, 402b, 602a, and 602b over the second absorption region 200 are aligned in the different directions, for example, in an orthogonal arrangement. Various designs of carrier control terminals can be adopted depending on the different pixel density requirements.

In the present disclosure, the photodetecting device includes a first photodetecting component and a second photodetecting component to absorb photons from different wavelengths. Besides, the first photo-carriers generated by the first photodetecting component and the second photo-carriers generated by the second photodetecting component are processed separately. In other words, the first photo-carriers generated by the first photodetecting component and the second photo-carriers generated by the second photodetecting component are processed by the first readout circuit of the first photodetecting component and the second readout circuit of the second photodetecting component respectively.

Figure 17:
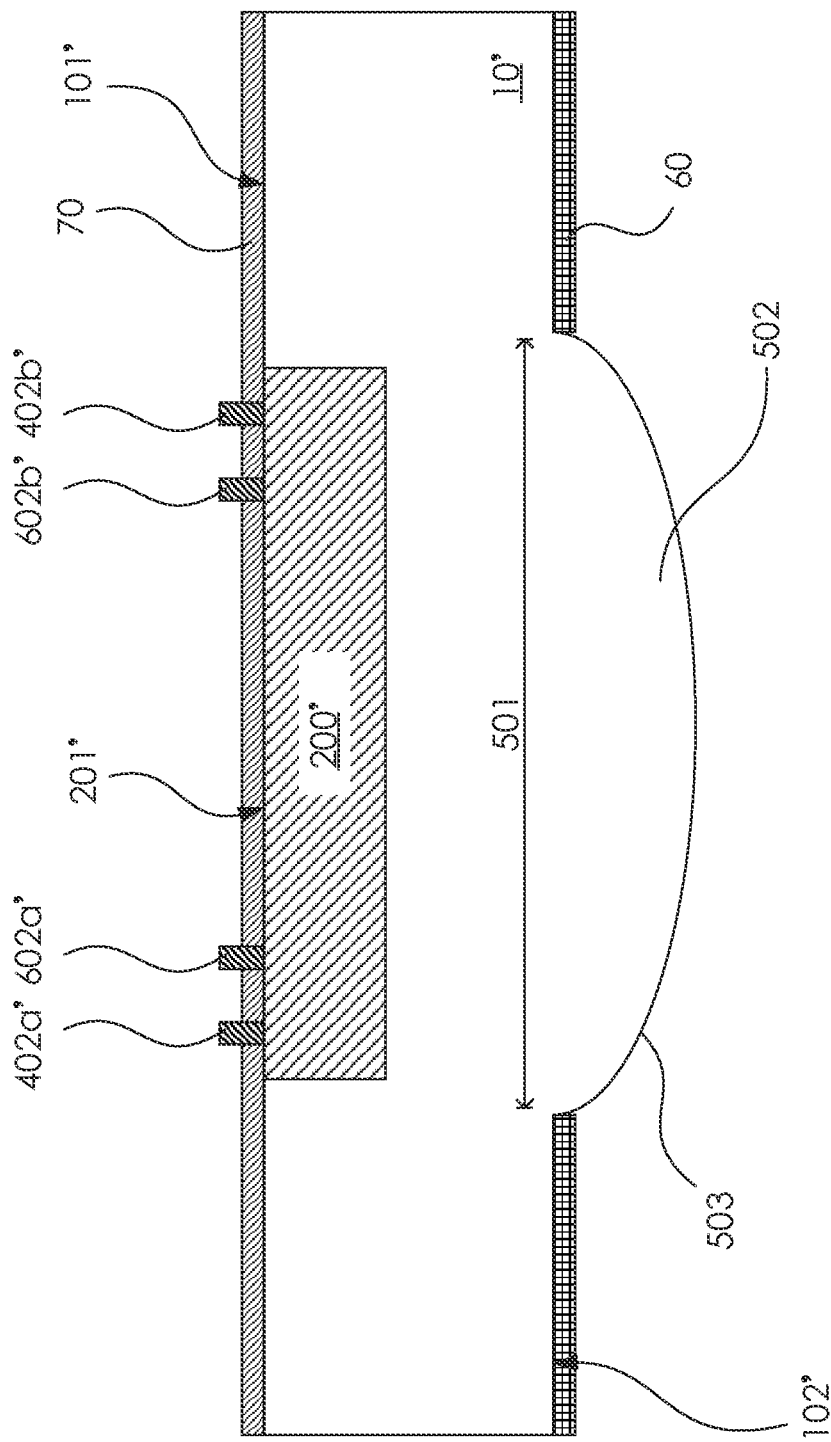
FIG. 17 illustrates a cross-sectional view of a photodetecting device according to some embodiments of the present disclosure.

FIG. 17 is a cross-sectional view of a photodetecting device, in accordance with some embodiments of the present disclosure. The photodetecting device includes a substrate 10', and an absorption region 200' supported by the substrate 10'. The material of the substrate 10' may be similar to the material of the substrate 10 described in FIG. 1 through FIG. 15 (FIGS. 15A to 15F). The absorption region 200' may be similar to the second absorption region 200 described in FIG. 1 through FIG. 15. The photodetecting device further includes carrier control terminals 402a', 402b' for electrically connected to two readout circuits respectively. The photodetecting device further includes carrier control terminals 602a', 602b' for electrically connected to two control circuits respectively. The material and the features of the carrier control terminals 402a', 402b', 602a', and 602b' may be similar to that of the carrier control terminals 402a, 402b, 602a, and 602b described in FIG. 15. The photodetecting device may also include doped regions 305, 307, and/or 306, 308 as described in FIG. 15. The photodetecting device may also include second well regions 309a, 309c, and/or 309b, 309d as described in FIG. 15.

The photodetecting device further includes a capping layer 70 over the absorption region 200'. In some embodiments, the capping layer 70 may be between the absorption region 200' and the carrier control terminals 402a', 402b', 602a', and 602b'. In some embodiments, the capping layer 70 may cover the surface 201' of the absorption region 200'. In some embodiments, the capping layer 70 may cover a portion of the first surface 101' of the substrate 10'. The capping layer 70 may be formed from a Complementary Metal Oxide Semiconductor (CMOS) process compatible material (CPCM), such as amorphous silicon, polysilicon, epitaxial silicon, aluminum oxide family (e.g., $Al_2O_3$), silicon oxide family (e.g., $SiO_2$), Ge oxide family (e.g., $GeO_2$), germanium silicon family (e.g., $Ge_{0.4}Si_{0.6}$), silicon nitride family (e.g., $Si_3N_4$), high k materials (e.g. $HfO_x$, $ZnO_x$, $LaO_x$, and $LaSiO_x$), and any combination thereof. The presence of the capping layer 70 over the surface 201' of the absorption region 200' may have various effects. For example, the capping layer 70 may act as a surface passivation layer to the absorption region 200', which may reduce dark current or leakage current generated by defects present at the exposed surface of the absorption region 200'. In the case of a germanium or a silicon germanium being the absorption region 200', the surface defects may be a source of dark current or leakage current, which contributes to an increased noise level of the photocurrent generated by the photodetecting device. By forming the capping layer 70 over the surface of the absorption region 200', the dark current or leakage current may be reduced, thereby reducing the noise level of the photodetecting device. As another example, the capping layer 70 may modulate a Schottky barrier level between the carrier control terminals 402a', 402b', 602a', and 602b' formed on the absorption region 200' and the absorption region 200'.

In some comparative embodiments, for high speed operation, an effective absorption region is typically around a range of from about 5% to about 20% of the full cell area of the photodetecting device. That is, a large portion of photons are blocked by a block layer 60 as shown in FIG. 17. In order to enhance the signal-to-noise ratio (SNR) of the photodetecting device, the photodetecting device may include an optical structure to enhance photon collection and direct more photons into the absorption region 200'.

In some embodiments, the block layer 60 includes an opening 501 for allowing an incident optical signal to enter into the absorption region 200'. In some embodiments, the optical structure is coupled to the substrate 10'. In some embodiments, the optical structure is overlapped with the opening 501 of the block layer 60 along the vertical direction from the substrate 10' to the absorption region 200'.

Referring to FIG. 17, in some embodiments, the substrate 10' includes a light incident area adjacent to the opening 501 of the block layer 60. The optical structure is formed at the light incident area. In some embodiments, the optical structure includes a convex structure 502 including an outer surface 503. By forming such convex structure 502, for example, a lens structure, on the second surface 102' of the substrate 10', more photons may be collected into the absorption region 200'. In some embodiments, an anti-reflection coating layer may be formed on the outer surface 503. In some embodiments, the anti-reflection coating layer may include or composed of oxide, nitride, oxynitride, high-k material, dielectric or a combination thereof. In some embodiments, a width of the opening 501 is not less than a width of the absorption region 200'. In some embodiments, the lens structure covers the entire absorption region 200' from a cross sectional view of the photodetecting device.

Figure 19:
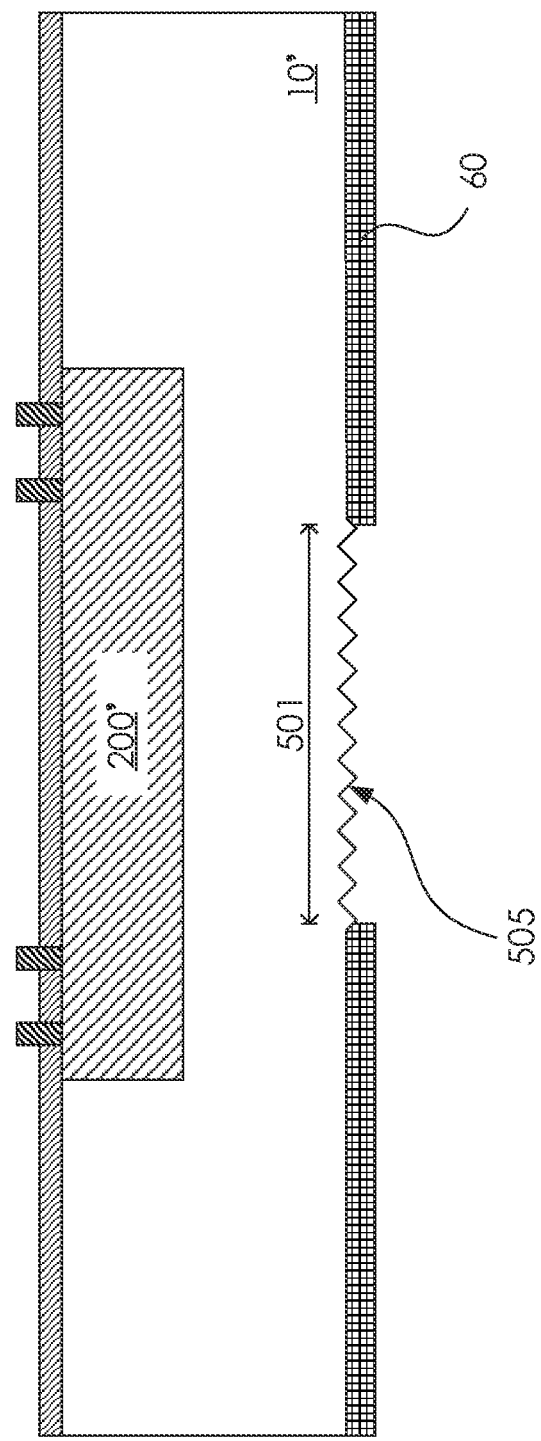
FIG. 19 illustrates a cross-sectional view of a photodetecting device according to some embodiments of the present disclosure.

Referring to FIGS. 18A and 18B, in some embodiments, the optical structure includes an irregular rough surface 504 at the light incident area. The irregular rough surface 504 is with a roughness (Ra) in a range of from about 0.1 μm to about 10 μm. Among such embodiments, the rough surface 504 may be extended to be in contact with the block layer 60. The embodiments as shown in FIGS. 18A and 18B may be fabricated by different operations, for instance, the rough surface 504 in FIG. 18A may be formed by a suitable roughening operation, for example, a wet etching or dry etching operation, prior to the formation of block layer 60. Apart from collecting more photons into the absorption region 200', such rough surface 504 may increase adhesion between the substrate 10' and the block layer 60. In some embodiments, as shown in FIG. 19, the optical structure may include a regular concave-convex structure 505 at the light incident area. In some embodiments, the regular concave-convex structure 505 may be composed of substantially regular recess and protrusion structure. A height of one of the protrusion structures is in a range of from about 0.1 μm to about 10 μm. By using suitable micro-machining operation, the regular concave-convex structure 505 can be formed. As such, more photons may be collected to the absorption region 200'.

Figure 20:
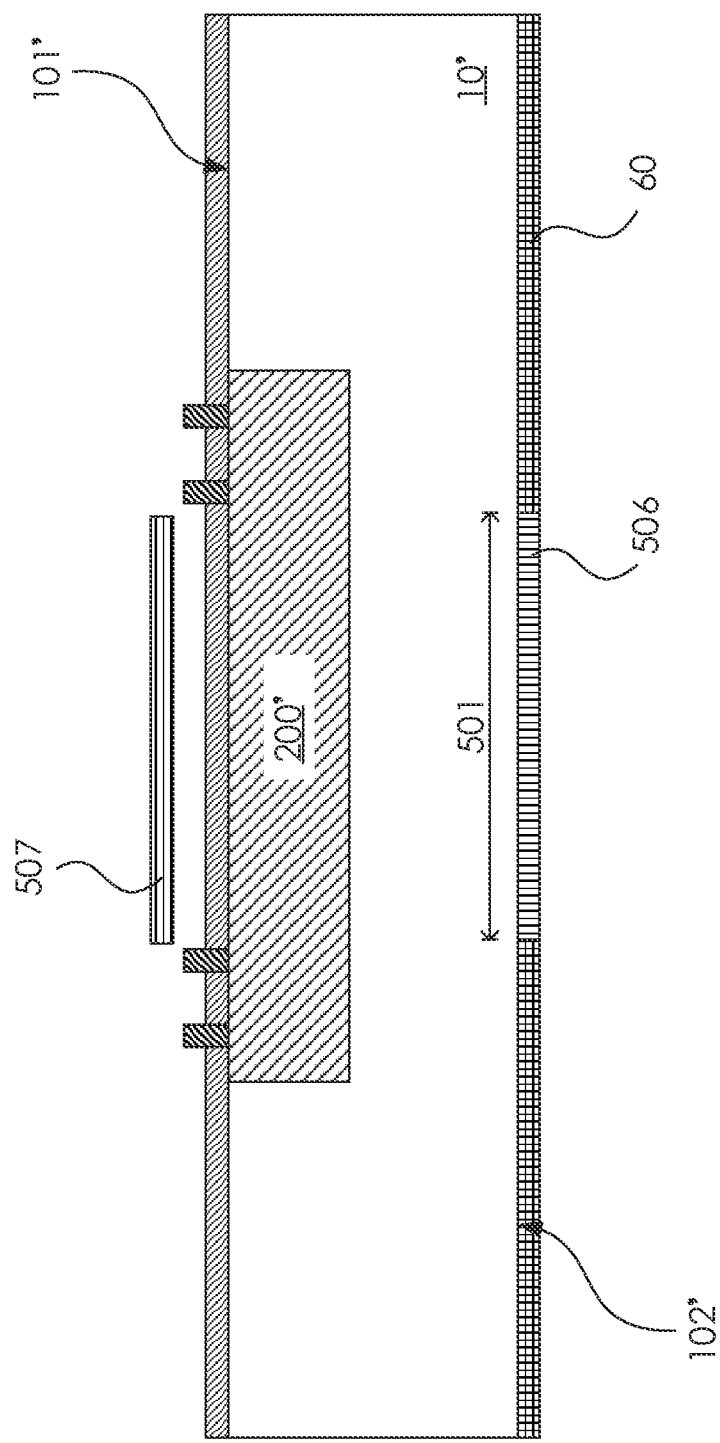
FIG. 20 illustrates a cross-sectional view of a photodetecting device according to some embodiments of the present disclosure.

Referring to FIG. 20, in some embodiments, the optical structure includes a first mirror 506 on the light incident area of the substrate 10'. In some embodiments, the first mirror 506 is in the opening 501 of the block layer 60. Moreover, the photodetecting device further includes a second mirror 507 adjacent to the first surface 101' of the substrate 10' and vertically aligned with the first mirror 506. In some embodiments, the first mirror 506 is a partial reflecting mirror which may provide required percentage reflection/transmission at a specific angle of incidence for both single and broad band wavelengths. To be more precisely, the first mirror 506 has a reflectivity lower than that of the second mirror 507 at the same wavelength. The first mirror 506 allows a portion of the light and its energy transmitted into the absorption region 200', and the second mirror 507 is a total reflector that reflects a majority of the light and its energy back into the absorption region 200'. The second mirror 507 may reflect a majority of the light back into the absorption region 200'. In some embodiments, the second mirror 507 is designed to have a reflectivity higher than 50% at the peak wavelength of the incident optical signal. In some embodiments, the second mirror 507 is designed to have as high reflectivity as allowable (i.e., greater than 90% or as close to 100% as possible) by the fabrication process. The second mirror 507 and the first mirror 506 may be a distributed Bragg reflector (DBR), a loop-mirror, a corner mirror, a metal mirror, an oxide mirror, a nitride mirror, a tapered DBR structure, or a suitable combination of the above.

By appropriately designing the first mirror 506 and the second mirror 507, the amplitude of overall interference of multiple reflections could be reduced, e.g., reaching a critical coupling condition, that is, an incident optical signal is incident on the first mirror 506, some of the optical signal escapes from the first mirror 506, and the rest of the optical signal enters the absorption area 200' and is reflected back to the first reflection mirror 506 by the second reflection mirror 507, wherein some of optical signal reflected back from the second reflecting mirror 507 will escape from the first reflecting mirror 506 again, and the rest of the optical signal reflected back from the second reflecting mirror 507 will be reflected by the first reflecting mirror 506 and enter the absorption region 200' again. The optical signals escaping from the first reflecting mirror 506 have different phases, for example, create destructive interferences to each other, so the total energy of the optical signals escaping from the first mirror 506 will be zero or near zero. Therefore, the photodetecting device may lock most of photons in the absorption region 200' and increase the probability of absorption.

In some embodiments, the first mirror 506 may include a multi-layer structure made by different materials, for instance, each of the first mirror 506 and the second mirror 507 may include a multi-layer structure including alternating first and second layers with different refractive indices, wherein the a first layer and an adjacent second layer are regarded as a pair.

Figure 21A:
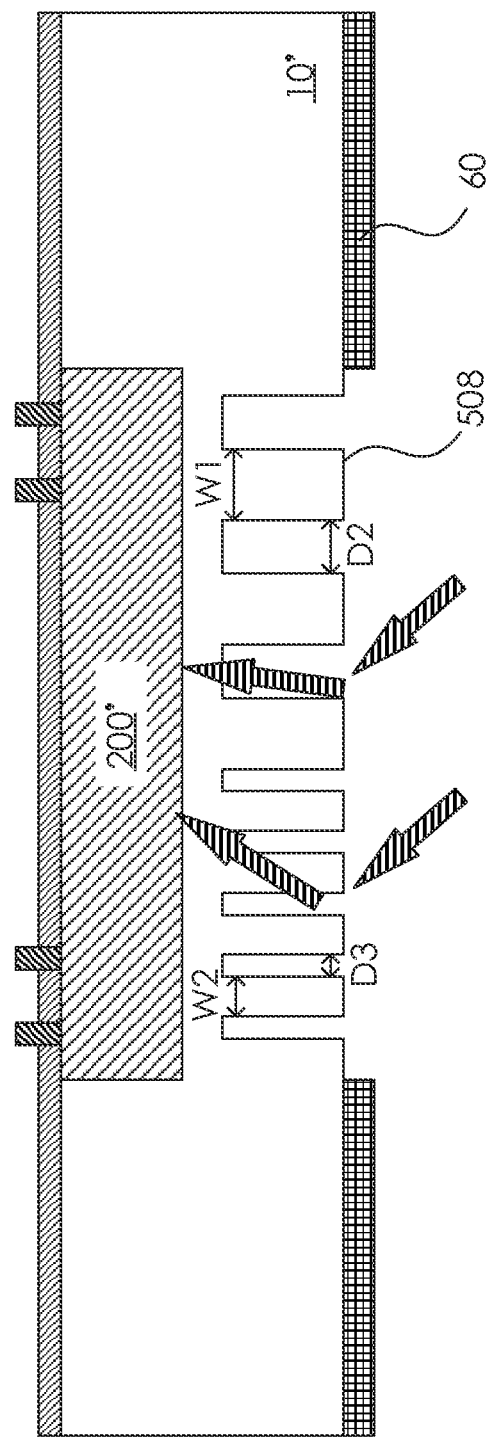
FIG. 21A illustrates a cross-sectional view of a photodetecting device according to some embodiments of the present disclosure.
Figure 21C:
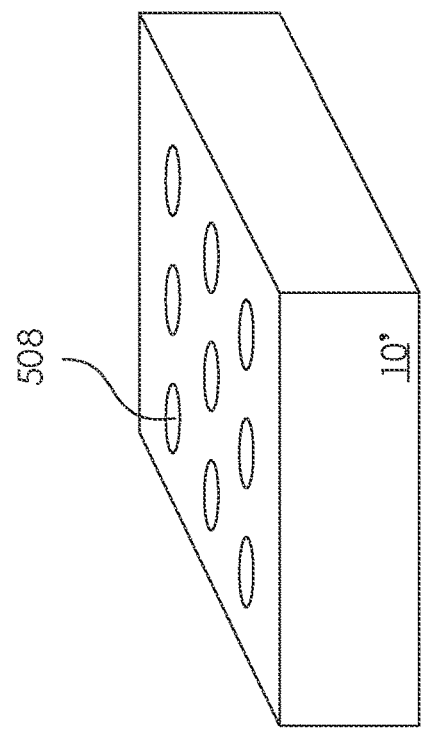
FIGS. 21B, 21C, and 21D illustrate stereogram views of a photonic crystal structure according to some embodiments of the present disclosure.
Figure 21B:
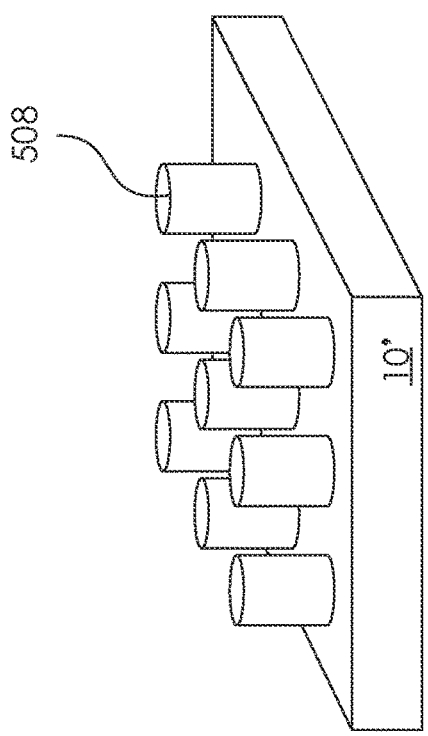
Figure 21D:
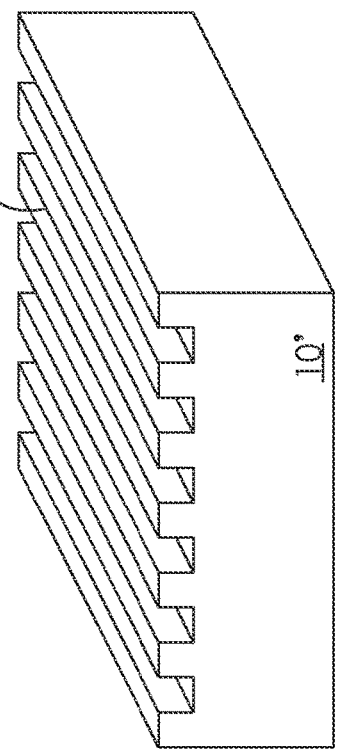

Referring to FIG. 21A, in some embodiments, the optical structure includes a photonic crystal structure 508 at the light incident area of the substrate 10'. The photonic crystal structure 508 includes multiple microstructures separated from each other. In some embodiments, a width W1 of one of the microstructures is different from a width W2 of another microstructure. In some embodiment, a distance D2 between two adjacent microstructures is different from a distance D3 between another two adjacent microstructures. By utilizing the photonic crystal structure such as those exemplified in FIGS. 21B to 21D, more photons can be collected into the absorption region 200' by suitable diffraction design. For example, it is possible to employ different arrangements of the microstructures according to the diffraction angles required to direct the incident photons into the absorption regions 200'. In some embodiments, the diffraction angles may be increased by increasing the density of the microstructures. For example, the distances between the two adjacent microstructures are gradually decreased along a horizontal direction away from the optical signal source. For another example, the widths of the two adjacent microstructures are gradually decreased along a horizontal direction away from the optical signal source. In some embodiments, if an optical signal source is positioned at the lower-right of the substrate 10', the distances between the two adjacent microstructures are gradually decreased from right to left. Or, the widths of the adjacent microstructures are gradually decreased from right to left. In some embodiments, the photonic crystal structure 508 may include a pillar array, as shown in FIG. 21B, a trench array, as shown in FIG. 21C, or a 1D grating, as shown in FIG. 21D.

Figure 22A:
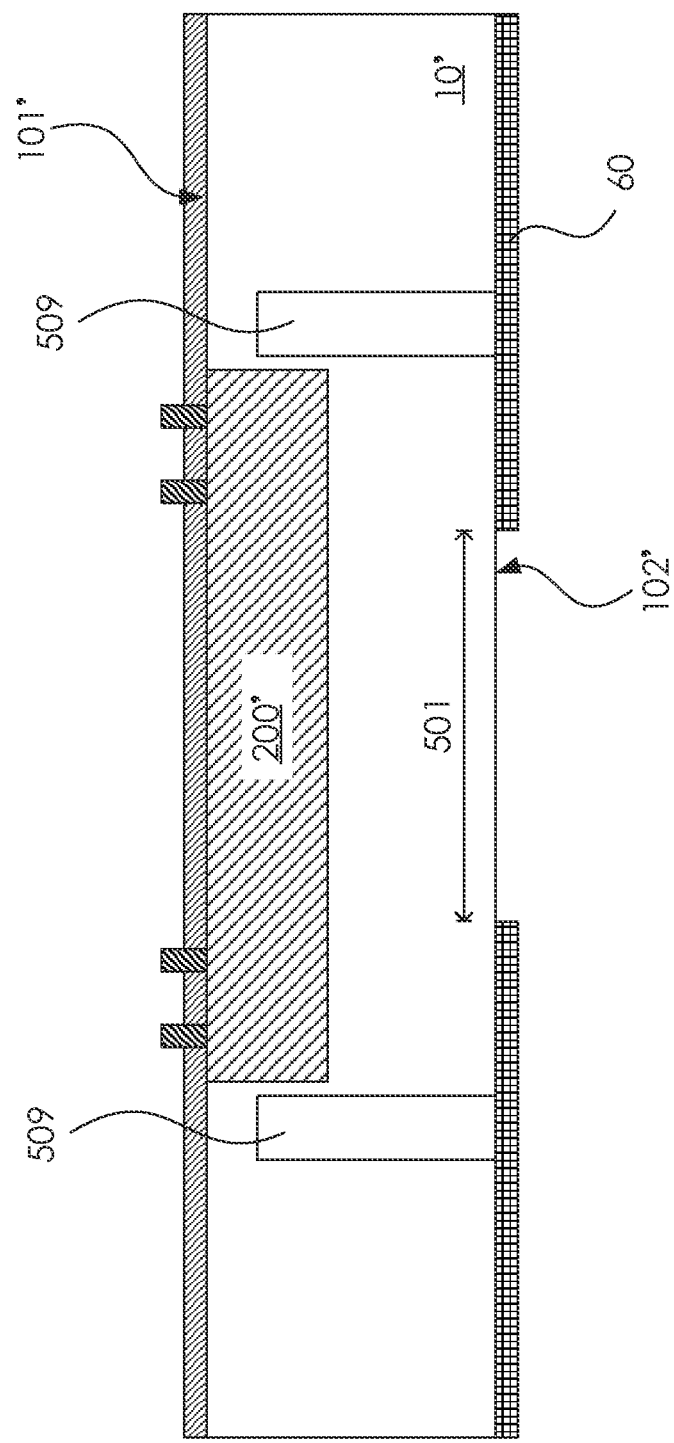
FIG. 22A illustrates a cross-sectional view of a photodetecting device according to some embodiments of the present disclosure.

Referring to FIG. 22A, in some embodiments, the photodetecting device further includes a confinement structure 509 disposed at two opposite sides of the absorption region 200'. In some embodiments, a refractive index of the material of the confinement structure 509 is lower than a refractive index of the material of the substrate 10'. By inserting the confinement structure 509 made by lower refractive index material adjacent to the absorption region 200', more photons may be collected by the absorption region 200' by enhanced internal reflection. In some embodiments, the confinement structure 509 may extend from the second surface 102' toward the first surface 101' of the substrate 10'. In some embodiments, the confinement structure 509 may be composed of $SiO_2$, porous structures, or void. In some embodiments, the confinement structure 509 includes dielectric materials, in some embodiments, a reflectivity of the material of the confinement structure 509 is higher than a reflectivity of the material of the substrate 10'. In some embodiments, the confinement structure 509 includes metal. By inserting the confinement structure 509 made by higher reflectivity material adjacent to the absorption region 200', more photons may be collected by the absorption region 200' by enhanced reflection.

Figure 22C:
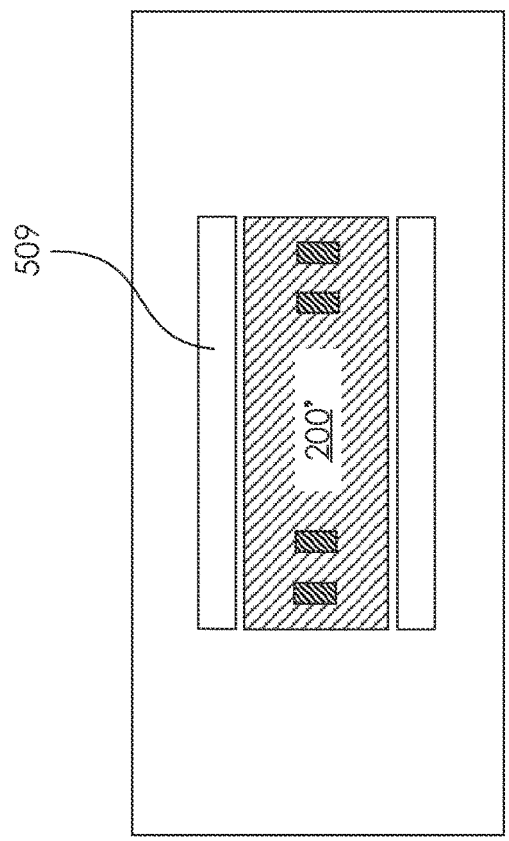
FIGS. 22B, 22C, and 22D illustrate top views of a photodetecting device according to some embodiments of the present disclosure.
Figure 22B:
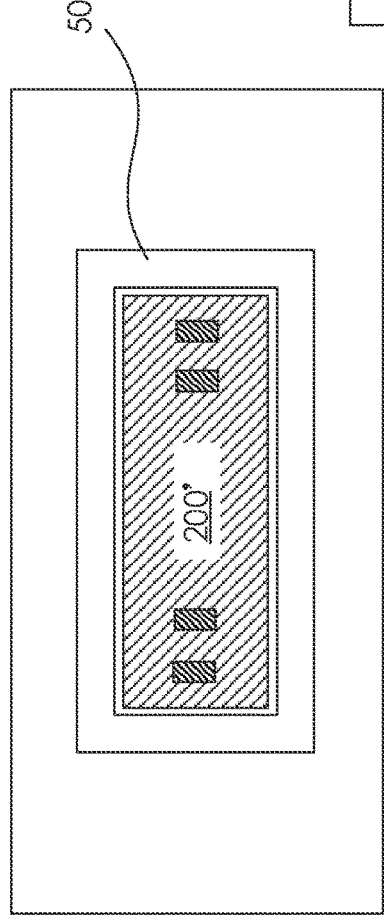
Figure 22D:
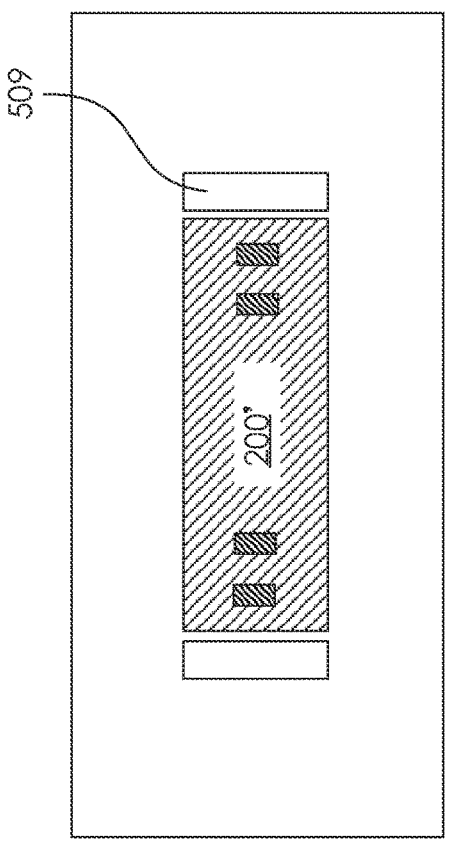

As shown in FIGS. 22B to 22D, the confinement structure 509 may be disposed at any sides of the absorption region 200', depending on different designs. For example, the confinement structure 509 may surround the entire absorption region 200' as shown in FIG. 22B.

In some embodiments, the structures in the embodiments of the present disclosure can be combined or changed. For example, the second photodetecting component described in FIG. 15 may also include the cap layer 70.

In one exemplary aspect, a photodetecting device is provided. The photodetecting device includes a first photodetecting component including a substrate and a second photodetecting component including a second absorption region. The substrate has a first absorption region configured to absorb photons having a first peak wavelength and to generate first photo-carriers. The second absorption region is supported by the substrate and configured to absorb photons having a second peak wavelength and to generate second photo-carriers. The first absorption region and the second absorption region are overlapped along a vertical direction.

In another exemplary aspect, a photodetecting device is provided. The photodetecting device includes a first photodetecting component, a second photodetecting component including a second absorption region. The first photodetecting component includes a substrate having a first absorption region. The first absorption region includes a first material. The first material has a first bandgap. The second absorption region is over the first absorption region. The second absorption region includes a second material. The second material has a second bandgap. The second bandgap is smaller than the first bandgap. The first photodetecting component further includes a first doped region of a first conductivity type and adjacent to the first absorption region and in contact with a surface of the substrate. The first photodetecting component further includes a second doped region of a second conductivity type and adjacent to the first absorption region and in contact with the surface of the substrate, wherein the first conductivity type is different from the second conductivity type.

In yet another exemplary aspect, a photodetecting device is provided. The photodetecting device includes a first photodetecting component and a second photodetecting component including a second absorption region. The first photodetecting component includes a substrate, a first doped region, and a second doped region. The substrate has a first surface, a second surface, and a first absorption region between the second surface and the first surface. The second absorption region is over the first absorption region, and the first surface of the substrate is between the second absorption region and the first absorption region. The first doped region of a first conductivity type is in the substrate and in contact with the second surface of the substrate. The second doped region of a second conductivity type is in the substrate and in contact with the second surface of the substrate.

In yet another exemplary aspect, a photodetecting device is provided. The photodetecting device includes a substrate including a light incident area, an absorption layer supported by the substrate, a block layer over a second surface of the substrate, and an optical structure coupled to the light incident area. The block layer includes an opening overlapped with the absorption region along the vertical direction.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetecting device, comprising:
  a first photodetecting component including a substrate having a first absorption region configured to absorb photons having a first peak wavelength and to generate first photo-carriers; and
  a second photodetecting component including a second absorption region configured to absorb photons having a second peak wavelength different from the first peak wavelength and to generate second photo-carriers;
  wherein the first photodetecting component further comprises two first readout circuits and two first control circuits for the first photo-carriers and electrically coupled to the first absorption region;
  wherein the second photodetecting component further comprises two second readout circuits and two second control circuits for the second photo-carriers and electrically coupled to the second absorption region, wherein the two second readout circuits are separated from the two first readout circuits, and the two second control circuits are separated from the two first control circuit; and
  wherein the first absorption region comprises silicon, and the second absorption region comprises germanium.

2. The photodetecting device of claim 1, wherein the first photodetecting component further comprises:
  a first doped region of a first conductivity type and proximal to a first surface of the substrate;
  a second doped region of a second conductivity type and proximal to the first surface of the substrate, wherein the second conductivity type is different from the first conductivity type;
  a third doped region of the first conductivity type in the substrate, wherein the first doped region and the third doped region are disposed at opposite sides of the first absorption region; and
  a fourth doped region of the second conductivity type in the substrate, wherein the second doped region and the fourth doped region are disposed at opposite sides of the first absorption region and are between the first doped region and the third doped region.

3. The photodetecting device of claim 2, wherein the first doped region and the third doped region are electrically coupled to the two first readout circuits respectively.

4. The photodetecting device of claim 2, wherein the second doped region and the fourth doped region are electrically coupled to the two first control circuits respectively.

5. The photodetecting device of claim 1, wherein the second photodetecting component further comprises:
  a fifth doped region of a first conductivity type electrically coupled to the second absorption region; and
  a sixth doped region of a second conductivity type electrically coupled to the second absorption region, wherein the second conductivity type is different from the first conductivity type;
  a seventh doped region of the first conductivity type coupled to the second absorption region; and
  an eighth doped region of the second conductivity type electrically coupled to the second absorption region;
  wherein the sixth doped region and the eighth doped region are between the fifth doped region and the seventh doped region.

6. The photodetecting device of claim 5, wherein the fifth doped region and the seventh doped region are electrically coupled to the two second readout circuits respectively.

7. The photodetecting device of claim 5, wherein the sixth doped region and the eighth doped region are electrically coupled to the two second control circuits respectively.

8. The photodetecting device of claim 1, wherein the second photodetecting component is supported by the substrate.

9. The photodetecting device of claim 1, wherein the first photodetecting component is a TOF sensor, and the second photodetecting component is a TOF image sensor.

10. A photodetecting device, comprising:
  a first photodetecting component including a substrate and a first absorption region in the substrate comprising a first material having a first bandgap, a first doped region of a first conductivity type adjacent to the first absorption region and in contact with a surface of the substrate, and a second doped region of a second conductivity type and adjacent to the first absorption region and in contact with the surface of the substrate, wherein the first conductivity type is different from the second conductivity type; and
  a second photodetecting component including a second absorption region, the second absorption region comprising a second material having a second bandgap, wherein the second bandgap is smaller than the first bandgap;
  wherein the first photodetecting component further comprises:
    a third doped region of the first conductivity type in the substrate, wherein the first doped region and the third doped region are disposed at opposite sides of the first absorption region; and
    a fourth doped region of the second conductivity type in the substrate, wherein the second doped region and the fourth doped region are disposed at opposite sides of the first absorption region; and wherein the first absorption region comprises silicon, and the second absorption region comprises germanium.

11. The photodetecting device of claim 10, wherein the second photodetecting component further comprises:
 a fifth doped region of the first conductivity type electrically coupled to the second absorption region; and
 a sixth doped region of the second conductivity type electrically coupled to the second absorption region.

12. The photodetecting device of claim 10, wherein the first photodetecting component is a TOF sensor, and the second photodetecting component is a CMOS image sensor.

13. The photodetecting device of claim 10, wherein the first photodetecting component further comprises two first readout circuits electrically coupled to the first absorption region, wherein the two first readout circuits are electrically coupled to the first doped region and the thirst doped region respectively.

14. A photodetecting device, comprising:
 a first photodetecting component including a substrate and a first absorption region in the substrate comprising a first material having a first bandgap, a first doped region of a first conductivity type adjacent to the first absorption region and in contact with a surface of the substrate, and a second doped region of a second conductivity type and adjacent to the first absorption region and in contact with the surface of the substrate, wherein the first conductivity type is different from the second conductivity type; and
 a second photodetecting component including a second absorption region, the second absorption region comprising a second material having a second bandgap, wherein the second bandgap is smaller than the first bandgap;
 wherein the second photodetecting component further comprises:
  a fifth doped region of the first conductivity type coupled to the second absorption region; and
  a seventh doped region of the first conductivity type coupled to the second absorption region and in contact with the surface of the second absorption region; and
 wherein the first absorption region comprises silicon, and the second absorption region comprises germanium.

15. The photodetecting device of claim 14, wherein the first photodetecting component is a CMOS sensor, and the second photodetecting component is a TOF image sensor.

16. The photodetecting device of claim 14, wherein the second photodetecting component further comprises:
 a sixth doped region of the second conductivity type and electrically coupled to the second absorption region, and
 an eighth doped region of the second conductivity type electrically coupled to the second absorption region;
 wherein the sixth doped region and the eighth doped region are between the fifth doped region and the seventh doped region.

17. The photodetecting device of claim 16, wherein the second photodetecting component further comprises two second readout circuits electrically coupled to the second absorption region, wherein the two second readout circuits are electrically coupled to the fifth doped region and the seventh doped region respectively.

* * * * *